(12) United States Patent
Laven et al.

(10) Patent No.: US 9,082,629 B2
(45) Date of Patent: Jul. 14, 2015

(54) SEMICONDUCTOR DEVICE AND METHOD FOR FORMING A SEMICONDUCTOR DEVICE

(71) Applicant: Infineon Technologies AG, Neubiberg (DE)

(72) Inventors: Johannes Georg Laven, Taufkirchen (DE); Hans-Joachim Schulze, Taufkirchen (DE); Roman Baburske, Otterfing (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/040,867

(22) Filed: Sep. 30, 2013

(65) Prior Publication Data

US 2015/0091051 A1    Apr. 2, 2015

(51) Int. Cl.
*H01L 29/66* (2006.01)
*H01L 29/06* (2006.01)
*H01L 29/739* (2006.01)

(52) U.S. Cl.
CPC ........ *H01L 29/0615* (2013.01); *H01L 29/0684* (2013.01); *H01L 29/66325* (2013.01); *H01L 29/7393* (2013.01)

(58) Field of Classification Search
USPC ........... 257/139, 197, 47, 273, 361, 362, 370, 257/383, 423, 511, 517, 525, 526, E29.027, 257/E29.066, E29.197, E29.201; 438/170, 438/189, 202, 203, 204, 205, 235, 236
See application file for complete search history.

(56) References Cited

U.S. PATENT DOCUMENTS

| | | | |
|---|---|---|---|
| 6,303,961 B1* | 10/2001 | Shibib | 257/335 |
| 2005/0035405 A1 | 2/2005 | Mauder et al. | |
| 2009/0096027 A1 | 4/2009 | Hirler et al. | |
| 2009/0160034 A1 | 6/2009 | Suzuki et al. | |
| 2009/0283799 A1 | 11/2009 | Ruething et al. | |
| 2011/0127576 A1 | 6/2011 | Schulze et al. | |

FOREIGN PATENT DOCUMENTS

WO    2009062876 A1    5/2009

OTHER PUBLICATIONS

Kimmer, et al. "Trenchstop 5: A New Application Specific IGBT Series." PCIM Europe 2012, Paper 11. VDE Verlag GmbH. May 2012, Nuremberg. pp. 120-127.

(Continued)

*Primary Examiner* — Timor Karimy
(74) *Attorney, Agent, or Firm* — Murphy, Bilak & Homiller, PLLC

(57) ABSTRACT

A semiconductor device includes an insulated gate bipolar transistor (IGBT) arrangement. The IGBT arrangement includes a carrier confinement reduction region laterally arranged between a cell region and a sensitive region. The IGBT arrangement is configured or formed so that the cell region has a first average density of free charge carriers in an on-state of the IGBT arrangement, the carrier confinement reduction region has a second average density of free charge carriers in the on-state of the IGBT arrangement and the sensitive region has a third average density of free charge carriers in the on-state of the IGBT arrangement. The first average density of free charge carriers is larger than the second average density of free charge carriers and the second average density of free charge carriers is larger than the third average density of free charge carriers.

20 Claims, 20 Drawing Sheets

(56) References Cited

OTHER PUBLICATIONS

Laska, et al. "The Field Stop IGBT (FS IGBT)—A New Power Device Concept with a Great Improvement Potential." ISPSD 2000. IEEE. May 2000, Toulouse. pp. 355-358.

Schulze, et al. "Increase of the Robustness of the Junction Terminations of Power Devices by a Lateral Variation of the Emitter Efficiency." Proceedings of the 25th International Symposium on Power Semiconductor Devices & ICs, Kanazawa. IEEE, 2013. pp. 257-260.

* cited by examiner

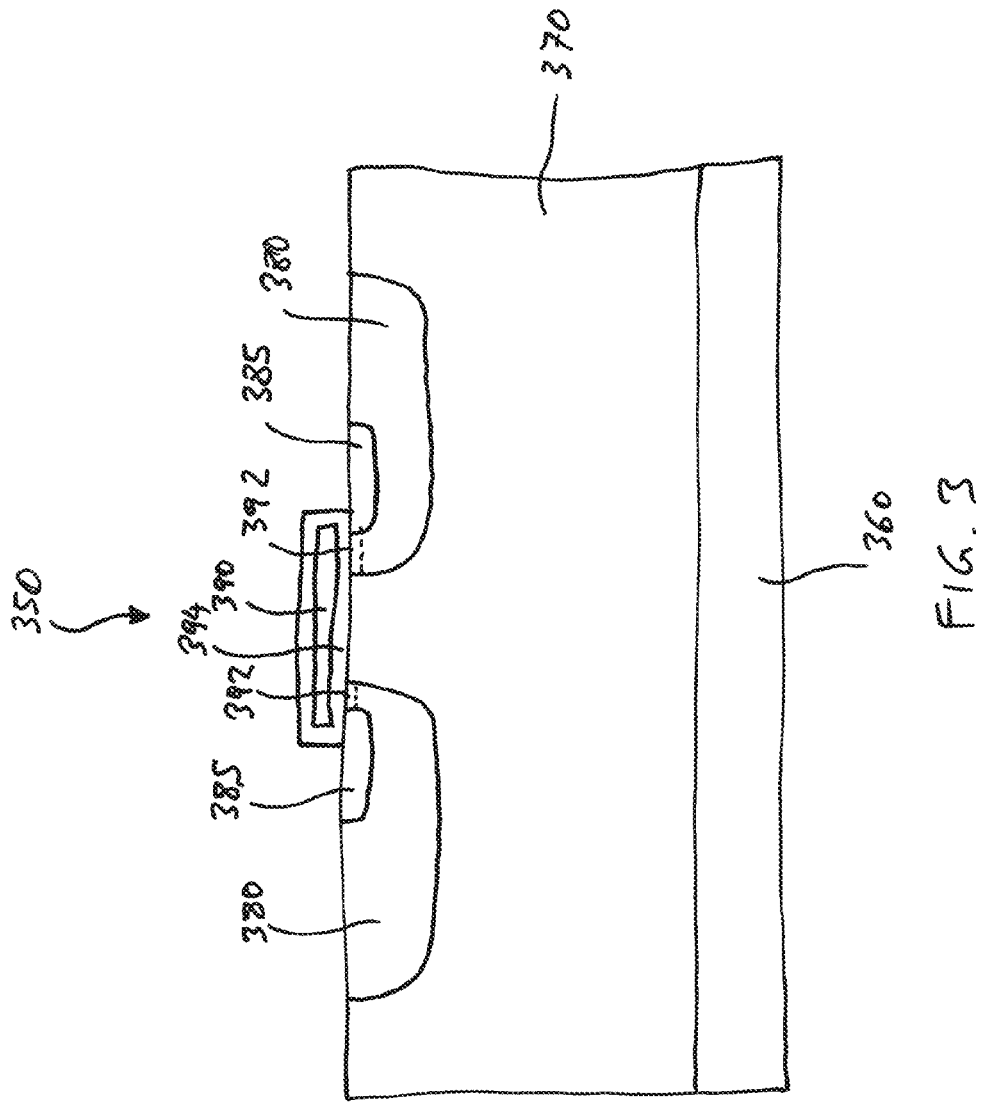

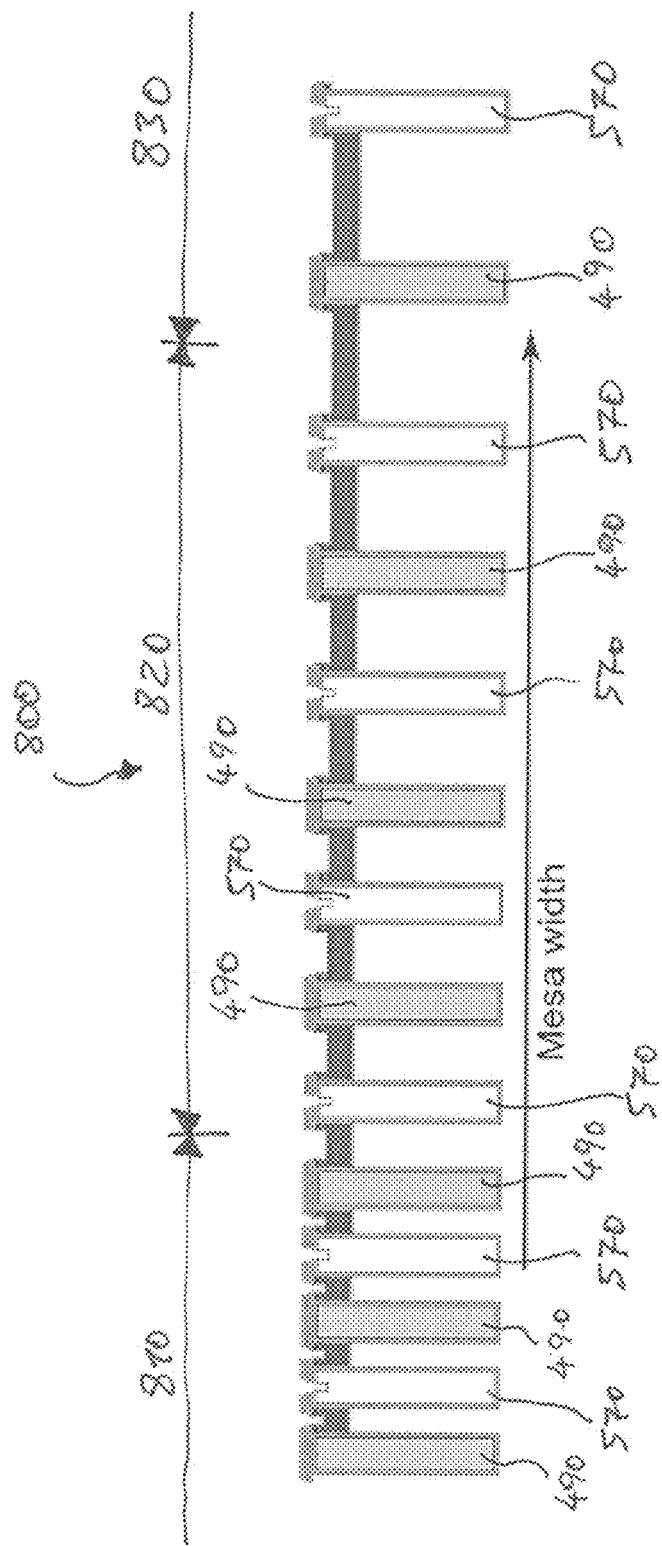

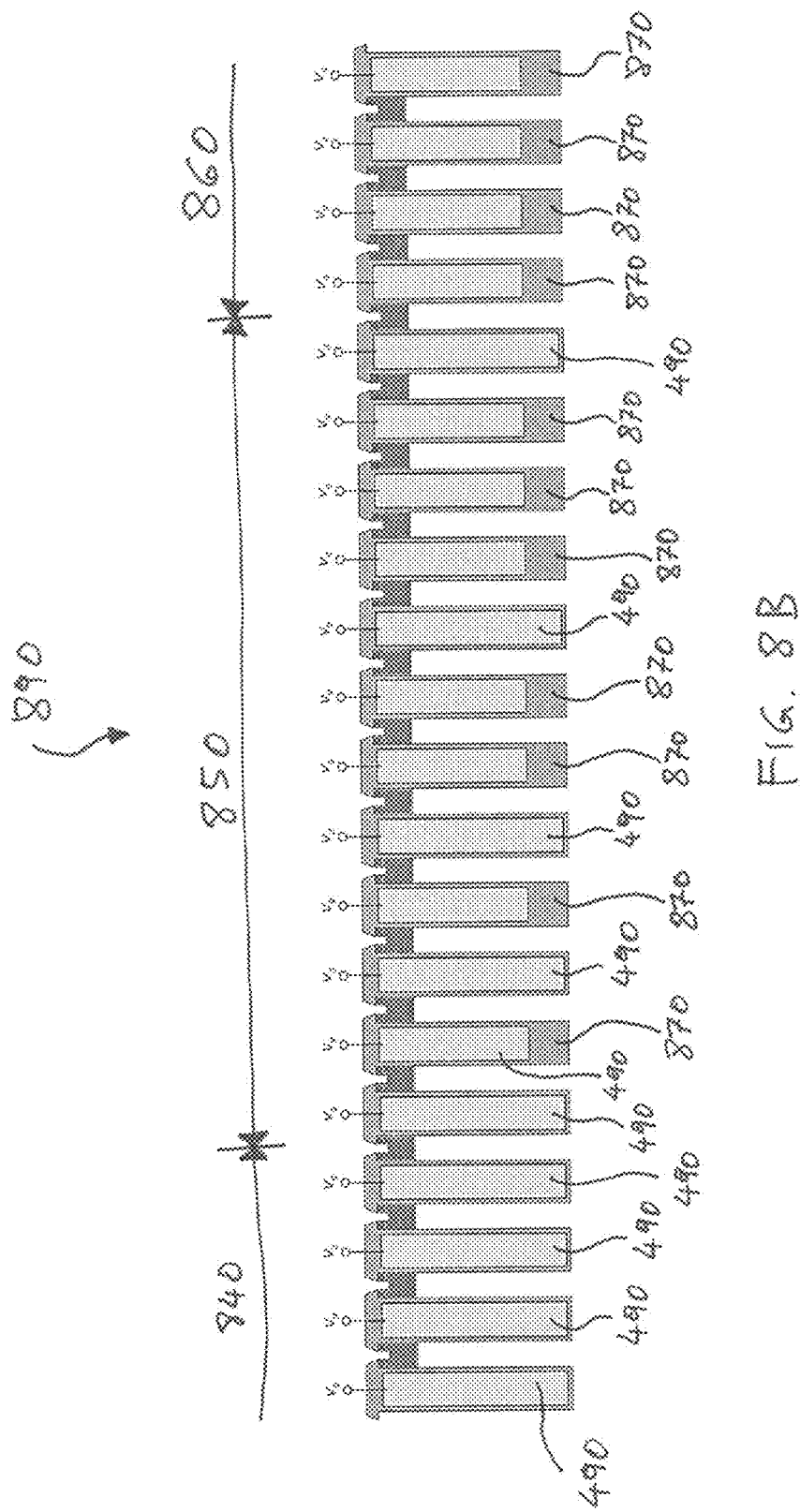

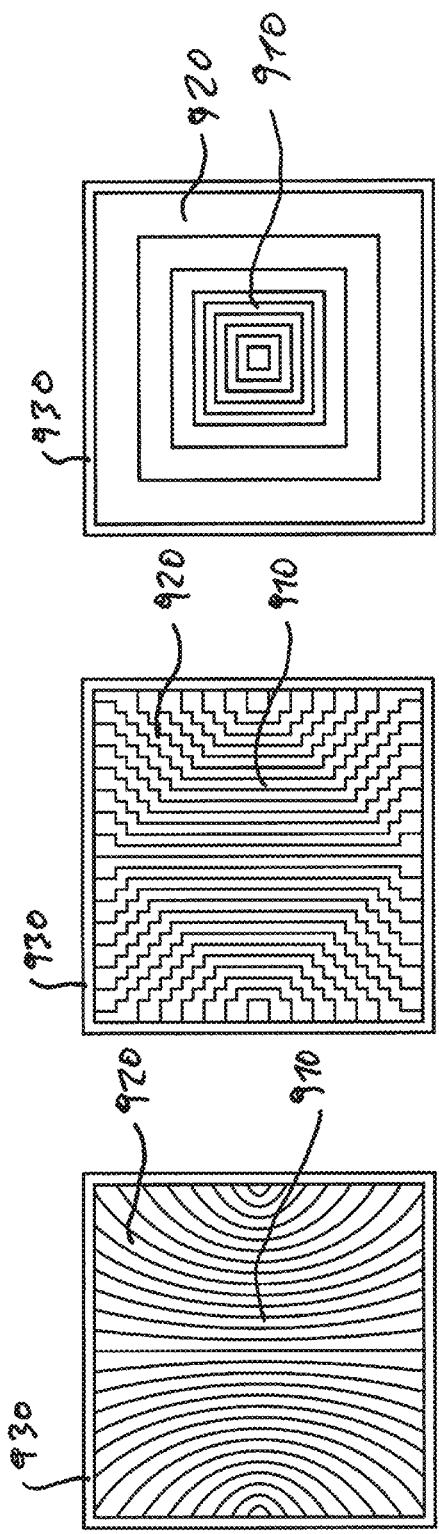

1900

Forming an insulated gate bipolar transistor arrangement

SEMICONDUCTOR DEVICE AND METHOD FOR FORMING A SEMICONDUCTOR DEVICE

TECHNICAL FIELD

Embodiments relate to measures for increasing the durability or life-cycle of semiconductor devices and in particular to a semiconductor device and a method for manufacturing a semiconductor device.

BACKGROUND

The breakdown of electronic devices is often caused by a degradation or disruption of a semiconductor device due to high currents. For example, during the shutdown or switching off of insulated gate bipolar transistor devices (IGBT) increased hole currents may occur, which may lead to dynamic avalanche and consequently to a destruction of the device. It is desired to decrease the risk of destruction due to high currents.

SUMMARY

An embodiment relates to a semiconductor device comprising an insulated gate bipolar transistor arrangement. The insulated gate bipolar transistor arrangement comprises a carrier confinement reduction region laterally arranged between a cell region and a sensitive region. Further, the insulated gate bipolar transistor arrangement is configured so that the cell region comprises a first average density of free charge carriers, a carrier confinement reduction region comprises a second average density of free charge carriers and the sensitive region comprises a third average density of free charge carriers in an on-state of the insulated gate bipolar transistor arrangement. The first average density of free charge carriers is larger than the second average density of free charge carriers and the second average density of free charge carriers is larger than the third average density of free charge carriers.

Some embodiments relate to a method for forming a semiconductor device. The method comprises forming an insulated gate bipolar transistor arrangement. The insulated gate bipolar transistor arrangement comprises a carrier confinement reduction region laterally arranged between a cell region and a sensitive region. The insulated gate bipolar transistor arrangement is formed so that the cell region comprises a first average density of free charge carriers, the carrier confinement reduction region comprises a second average density of free charge carriers and the sensitive region comprises a third average density of free charge carriers in an on-state of the insulated gate bipolar transistor arrangement. The first average density of free charge carriers is larger than the second average density of free charge carriers and the second average density of free charge carriers is larger than the third average density of free charge carriers.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which

FIG. 3 shows a schematic illustration of a part of an insulated gate bipolar transistor arrangement;

FIG. 8A shows a schematic cross-section of a part of a further Mesa-insulated gate bipolar transistor arrangement;

FIG. 8B shows a schematic cross-section of a part of a further Mesa-insulated gate bipolar transistor arrangement;

FIGS. 9A to 9C show schematic top views of semiconductor devices;

FIG. 19 shows a flowchart of a method for forming a semiconductor device.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Figure 1A:
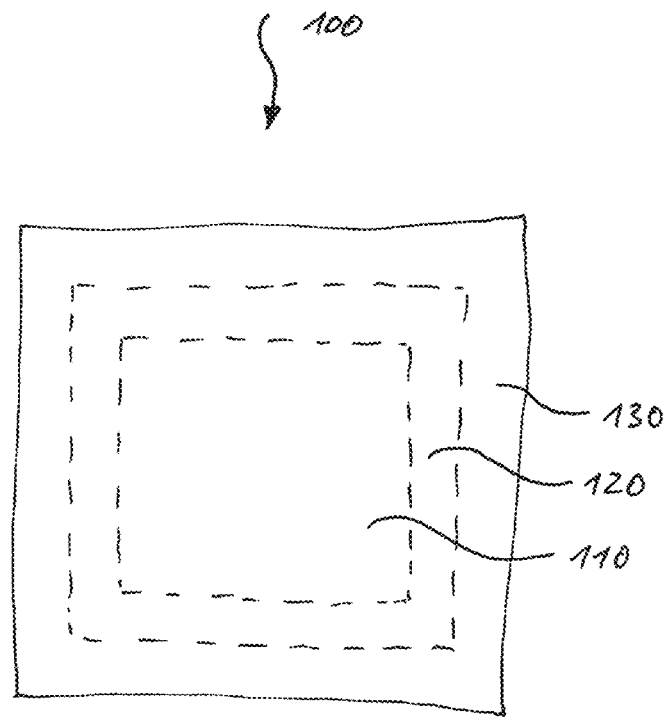
FIG. 1A shows a schematic top view of a semiconductor device.

FIG. 1A shows a top view of a semiconductor device 100 according to an embodiment. The semiconductor device 100 comprises an insulated gate bipolar transistor arrangement. The insulated gate bipolar transistor arrangement comprises a carrier confinement reduction region 120 laterally arranged between a cell region 110 and a sensitive region 130. The insulated gate bipolar transistor arrangement is configured or formed so that the cell region 110 comprises a first average density of free charge carriers in an on-state of the insulated gate bipolar transistor arrangement, the carrier confinement reduction region 120 comprises a second average density of free charge carriers in the on-state of the insulated gate bipolar transistor arrangement and the sensitive region 130 comprises a third average density of free charge carriers in the on-state of the insulated gate bipolar transistor arrangement. The first average density of free charge carriers is larger than the second average density of free charge carriers and the second average density of free charge carriers is larger than the third average density of free charge carriers.

By implementing measures to reduce an average density of free charge carriers towards a sensitive region, destructive effects (e.g. dynamic avalanche) during shutdown or switching off of a semiconductor device with an insulated gate bipolar transistor arrangement can be reduced or avoided. In this way, the durability or the life-cycle of the semiconductor device can be significantly increased.

The semiconductor device 100 may be implemented by any semiconductor processing technology capable of forming insulated gate bipolar transistor structures, for example. In other words, the semiconductor device 100 may be a silicon-based semiconductor structure, a silicon carbide-based semiconductor structure, a gallium arsenide-based semiconductor structure or a gallium nitride-based semiconductor structure, for example. A semiconductor device 100 may comprise mainly or only the insulated gate bipolar transistor arrangement or may comprise further electrical elements or circuits (e.g. control unit for controlling the insulated gate bipolar transistor arrangement or a power supply unit).

The insulated gate bipolar transistor arrangement comprises a plurality of insulated gate bipolar transistor structures distributed over the cell region 110 and the carrier confinement reduction region 120. Further, insulated gate bipolar transistor structures of the plurality of insulated gate bipolar transistor structures may also be distributed over the sensitive region or the sensitive region may not comprise insulated gate bipolar transistor structures. The insulated gate bipolar transistor structures of the plurality of insulated gate bipolar transistor structures may each comprise a collector area, a drift or base area, a body area, a source area and a gate or at least a part of the plurality of insulated gate bipolar transistor structures (or all) share a common collector layer and/or a common drift layer, but may comprise separate body areas, source areas and gates, for example.

The carrier confinement reduction region 120 is laterally arranged between the cell region 110 and the sensitive region 130. In other words, the carrier confinement reduction region 120 laterally separates the cell region 110 and the sensitive region 130. The carrier confinement reduction region separates the cell region 110 from the sensitive region 130 laterally if the carrier confinement reduction region is arranged between the cell region 110 and the sensitive region 130 in a top view of the semiconductor device 100, for example.

A top view of the semiconductor device 100 may be a view from a point of view located above a main surface of the semiconductor device 100.

A main surface of the semiconductor device 100 may be a semiconductor surface of the device towards metal layers, insulation layers or passivation layers on top of the semiconductor surface. In comparison to a basically vertical edge (e.g. resulting from separating the semiconductor dies from others) of the semiconductor structure, the main surface of the semiconductor structure may be a basically horizontal surface extending laterally. The main surface of the semiconductor structure may be a basically even plane (e.g. neglecting unevenness of the semiconductor structure due to the manufacturing process). In other words, the main surface of the semiconductor device 100 may be the interface between the semiconductor material and an insulation layer, metal layer or passivation layer on top of the semiconductor substrate.

In other words, a lateral direction or lateral expansion may be oriented basically in parallel to the main surface and a vertical direction or vertical expansion may be oriented basically orthogonal to the main surface.

Figure 1B:
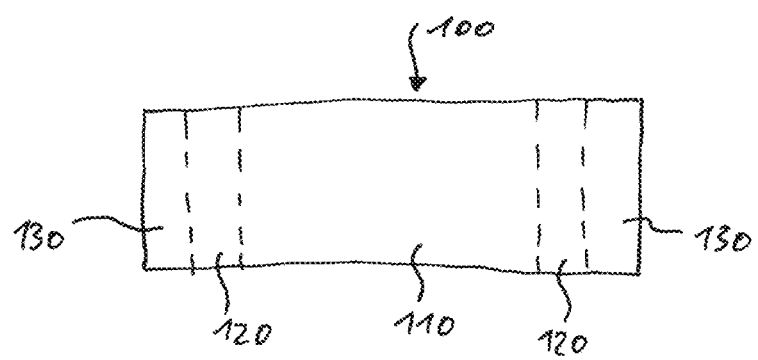
FIG. 1B shows a schematic cross-section of the semiconductor device shown in FIG. 1A.
Figure 2A:
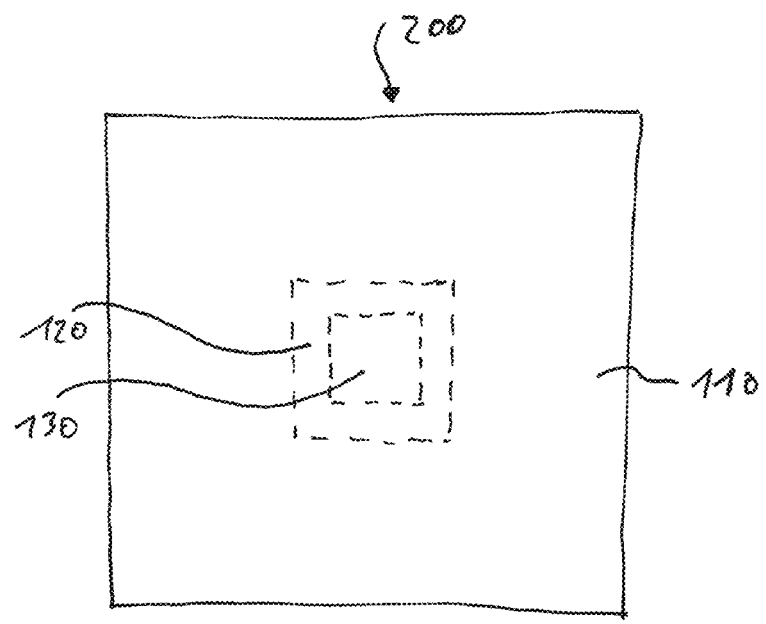
FIG. 2A shows a schematic top view of a further semiconductor device.

For example, the carrier confinement reduction region laterally surrounds the cell region (e.g. FIG. 1A) or the sensitive region (e.g. FIG. 2A), for example. A region may be laterally surrounded by another region, if the region is completely encircled by the other region in a top view. However, a region may not enclose another region or may not vertically surround (e.g. in the depth of the semiconductor device or in a cross-section) in order to laterally surround another region as it is shown in FIG. 1B, for example. FIG. 1B shows the arrangement of the cell region 110, the carrier confinement reduction region 120 and the sensitive region 130 in a cross section of the semiconductor device 100 shown in FIG. 1A (indicated by the dashed lines).

The cell region 110 of the insulated gate bipolar transistor arrangement may be a region laterally expanding over the semiconductor device 100 comprising or providing more than 50% (or more than 70%, more than 80% or more than 90%) of the current flow through the insulated gate bipolar transistor arrangement of the semiconductor device 100 in an on-state of the insulated gate bipolar transistor arrangement. The size of the cell region may be dependent on the absolute current-rating of the chip (i.e., the total chip size), whereas the size of the carrier confinement reduction region may be independent on the current-rating for constant current-density ratings but may depend on the current-density.

The sensitive region 130 may be a region laterally expending over the semiconductor device 100 comprising an increased risk for destruction due to high current densities or high-electric fields (e.g. occurring during shut-down or switching off of the insulated gate bipolar transistor arrangement). For example, the sensitive region 130 may be an edge region surrounding the semiconductor device, a pad region (e.g. gate pad), a gate wiring (e.g. on-chip wiring) region or gate leads region (electrical connection between gate pad and the gates or a gate control module and gates) or a thermally endangered region (e.g. region without sufficient cooling possibilities). A thermally endangered region may be a region which would comprise a highest temperature in an on-state of the insulated gate bipolar transistor arrangement, if the current flow or the average density of free charge carriers would be equal to the current flow or the average density of free charge carriers of the cell region 110.

The carrier confinement reduction region 120 is laterally arranged between the cell region 110 and the sensitive region 130 in order to reduce the influence of the high currents occurring in the cell region on the sensitive region 130. For example, the carrier confinement reduction region 120 may provide a significantly larger portion to the overall current flow through the insulated gate bipolar transistor arrangement than the sensitive region 130. For example, the sensitive region 130 provides no (e.g. no source regions located in the sensitive region) or only a small contribution (e.g. less than 50%, less than 10% or less than 1%) to the overall current through the insulated gate bipolar transistor arrangement in an on-state of the insulated gate bipolar transistor arrangement.

The on-state of the insulated gate bipolar transistor arrangement may be a state, in which the insulated gate bipolar transistor arrangement (e.g. the sum of all insulated gate bipolar transistor structures comprised by the insulated gate bipolar transistor arrangement) provides a maximal overall current under normal or intended operation conditions of the semiconductor device 100 or provides a nominal current (e.g. according to the specification of the device). A nominal current may be a current, which the device is able to provide in an on-state for more than 50% (or more than 70% or more than 90%) of a life time to be reached by the device, for example.

In an on-state of the insulated gate bipolar transistor arrangement, the cell region 110, the carrier confinement reduction region 120, and the sensitive region 130 comprise different sizes of contribution to the overall current per area (e.g. due to their structural configuration or electrical control or driving). In other words, the cell region 110, the carrier confinement reduction region 120 and the sensitive region 130 comprise different average densities of free charge carriers in an on-state of the insulated gate bipolar transistor arrangement. The average density of free charge carriers within a specific region may be a number of free charge carriers per volume or per die area. Due to structural inhomogeneities (e.g. positions of gates, sources and/or body areas) the density of free charge carriers may vary within the cell region, the carrier confinement reduction region 120 and the sensitive region 130. However, the (first) average density of free charge carriers within the cell region 110 is larger than the (second) average density of free charge carriers within the carrier confinement reduction region 120 and the (second) average density of free charge carriers within the carrier confinement reduction region 120 is larger than the (third) average density of free charge carriers within the sensitive region 130. In other words, the carrier confinement within the cell region 110 is larger than the carrier confinement within the carrier confinement reduction region 120 and the carrier confinement within the carrier confinement reduction region 120 is larger than the carrier confinement within the sensitive region 130.

The cell region 110, the carrier confinement reduction region 120 and/or the sensitive region 130 may comprise various geometries. Further, an arbitrary number of cell regions 110, carrier confinement reduction regions 120 and/or sensitive regions 130 may be contained by the semiconductor device 110.

Figure 2B:
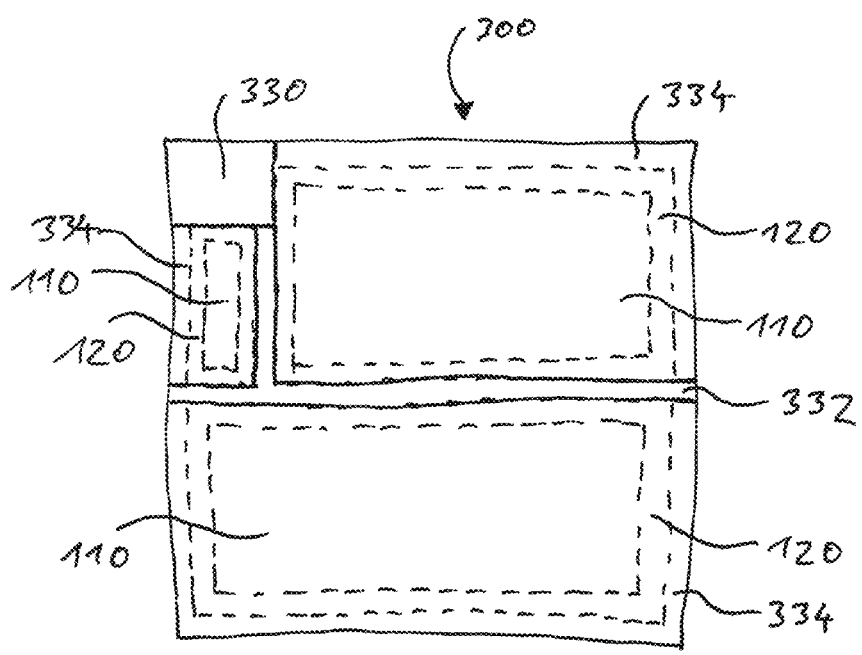
FIG. 2B shows a schematic top view of a further semiconductor device.

For example, the semiconductor device 100 may comprise only one or more than one sensitive regions 130 laterally separated from the cell region 110 (or more than one cell region) by at least one carrier confinement reduction region 120. An example for only one sensitive region 130 is shown in FIG. 1A (e.g. an edge region or edge termination region) and by the semiconductor device 200 shown in FIG. 2A (e.g. a thermally endangered region and a middle of the semiconductor device). Further, FIG. 2B shows a schematic top view of a semiconductor device 300 according to an embodiment. The semiconductor device 300 comprises a first sensitive region 330 (e.g. a gate pad or a gate pad region in the proximity of a gate pad or surrounding a gate pad), a second sensitive region 332 (e.g. gate wiring or region in the proximity of a gate wiring) and a third sensitive region 334 (e.g. an edge region or edge termination region of the semiconductor device). Due to the differential geometries of the sensitive regions, the cell region 110 is divided in three areas, each of the cell regions is surrounded by a carrier confinement reduction region 120 separating the cell region 110 from the sensitive regions.

The average density of free charge carriers within the carrier confinement reduction region 120 averaged through the whole carrier confinement reduction region 120 lies between the average density of free charge carriers of the cell region 110 and the average density of free charge carriers of the sensitive region 130. However, optionally, an average local density of free charge carriers (e.g. averaged over a part of the carrier confinement reduction region) may vary within the carrier confinement reduction region 120. For example, an average density of free charge carriers within a first half of the carrier confinement reduction region 120 arranged adjacent to the cell region 130 may be higher than an average density of free charge carriers within a second half of the carrier confinement reduction region 120 located adjacent to the sensitive region 130. In other words, the carrier confinement reduction region 130 may comprise a density of free charge carriers in an on-state of the insulated gate bipolar transistor arrangement decreasing from a border to the cell region 110 to a border of the sensitive region 130. For example, the average local density of free charge carriers may decrease continuously or stepwise from the border towards the cell region 110 to the border towards the sensitive region 130.

The carrier confinement reduction region 120 may comprise a lateral width varying in a wide range. A carrier confinement reduction region 120 with large width may provide a better protection of the sensitive region 130 than a carrier confinement reduction region 120 with smaller width. However, a larger carrier confinement reduction region 120 may reduce the area remaining for the cell region 130 and consequently may reduce a maximal current flow through the semiconductor device 100, for example.

A lateral movement of free charge carriers may be in the range of the diffusion length of the free charge carriers within the used semiconductor material. Therefore, a lateral width of the carrier confinement reduction region 112 may be chosen in the range of the diffusion length of the free charge carriers within the carrier confinement reduction 120 so that a probability for free charge carriers leaving the cell region 110 and entering the sensitive region 130 is kept low. For example, the carrier confinement reduction region 120 may comprise a lateral width of less than twice (or less than 5 times, less than 1.5 times or less than 1 time) a diffusion length of free charge carriers in the carrier confinement reduction region 120 (e.g. the material used for at least a part of the carrier confinement reduction region). Alternatively, the thickness of the semiconductor device 100 (e.g. the semiconductor substrate of the semiconductor device) may practically limit the diffusion length, since the free charge carriers may reach the backside of the semiconductor device 100 before reaching a significant larger lateral distance than the thickness of the semiconductor device. In other words, alternatively, the carrier confinement reduction region 120 may comprise a lateral width of less than twice (or less than 5 times, less than 1.5 or than 1 time) a thickness of the semiconductor device 100. The thickness of the semiconductor device 100 may be a thickness of the semiconductor substrate used for implementing the insulated gate bipolar transistor arrangement, for example.

In this way, the area consumption of the carrier confinement reduction region 120 can be kept low, while an improved protection of the sensitive region 130 can be provided.

Alternatively or additionally, a sufficient protection of the sensitive region 130 may be already obtained with a carrier confinement reduction region 120 with a lateral width below the diffusion length of the free charge carriers. For example, the carrier confinement reduction region 120 may comprise a lateral width of more than half (or more than 30% or more than 80%) of a diffusion length of free charge carriers within the carrier confinement reduction region 120 or more than half (or more than 30% or more than 80%) of the thickness of the semiconductor device 100. In this way, the area required for the carrier confinement reduction region 120 can be kept low, while an improved protection of the sensitive region 130 can be provided.

An insulated gate bipolar transistor structure of a plurality of insulated gate bipolar transistor structures included by the insulated gate bipolar transistor arrangement can be implemented in various ways.

FIG. 3 shows a schematic cross-section of a part of an insulated gate bipolar transistor arrangement 350 according to an embodiment. The insulated gate bipolar transistor arrangement 350 comprises a semiconductor structure (e.g. silicon-based or silicon carbide-based) comprising a collector layer 360, a drift layer 370, a plurality of body areas 380, a plurality of source areas 385 and a gate 390 of a plurality of gates 390 (e.g. of similar or equal structures distributed over the insulated gate bipolar transistor arrangement). The plurality of source areas 385 and the drift layer 370 comprise at least mainly a first conductivity type (e.g. n or p) and the plurality of body areas 380 and the collector layer 360 comprise at least mainly a second conductivity type (e.g. p or n). The plurality of gates 390 are arranged so that the gates 390 are capable of causing a conductive channel 392 between the source areas 385 and the drift layer 370 through the body areas 380. The gates 390 may be electrically insulated from at least the body areas 380 by an insulation layer 394 (e.g. gate oxide layer).

The body areas 380 and the collector layer 360 comprise the second conductivity type which can be a p-doping (e.g. caused by incorporating aluminum ions or boron ions) or an n-doping (e.g. caused by incorporating nitrogen ions, phosphor ions or arsenic ions). Consequently, the second conductivity type indicates an opposite n-doping or p-doping. In other words, the first conductivity type may indicate an n-doping and the second conductivity type may indicate a p-doping or vice-versa.

The collector layer 360, the drift layer 370, the plurality of body areas 380 and the plurality of source areas 385 may comprise mainly a specific conductivity type, if the part of the semiconductor structure occupied by the collector layer 360, the drift layer 370, the plurality of body areas 380 or the plurality of source areas 385 comprises a doping of the second conductivity type over more than 50% (or more than 70%, more than 80% or more than 90%) of the volume, for example.

The plurality of gates 390 may be arranged so that the gates 390 cause a conductive channel 392 between the source areas 385 and the drift layer 370 through the body areas 380 according to a field effect transistor principle. In other words, the plurality of gates 390 are arranged in the proximity of the body areas 380 but electrically insulated from the body area 380 by an insulation layer 390 so that a conductive channel 392 between the source areas 385 and the drift layer 370 can be controlled by a voltage applied to the gates 390.

The cell region 130, the carrier confinement reduction region 120 and/or the sensitive region 130 may each comprise a plurality of equal or similar structures as shown in FIG. 3. The gates 390 and the source areas 385 of the cell region 110, the carrier confinement reduction region 120 and/or the sensitive region 130 may be connected to separate gate and source contacts. Alternatively, the gates 390 and the source areas 385 of the cell region 110, the carrier confinement reduction region 120 and/or the sensitive region 130 may be connected to common source and/or gate contacts (e.g. so that basically the same voltage is applied to the sources and/or the gates of the cell region, the carrier confinement reduction region and/or the sensitive region at least in an on-state of the insulated gate bipolar transistor arrangement).

Alternatively, the sensitive region 130 may comprise no such structures so that the average density of free charge carriers in the sensitive region 130 is basically caused by free charge carriers reaching the sensitive region 130 through the carrier confinement reduction region 120 (e.g. if the sensitive region is an edge region or edge termination region).

In an on-state of the insulated gate bipolar transistor arrangement 350, the free charge carriers may be mainly located within the drift layer 370 so that an average density of free charge carriers can be represented by the density of free charge carriers within the drift layer. In other words, the cell region 110 may comprise the first average density of free charge carriers within the drift layer in an on-state of the insulated gate bipolar transistor arrangement, the carrier confinement reduction region 120 comprises the second average density of free charge carriers within the drift layer 370 in an on-state of the insulated gate bipolar transistor arrangement 350 and the sensitive region 130 comprises the third average density of free charge carriers within the drift layer 370 in an on-state of the insulated gate bipolar transistor arrangement 350. This may be valid also for other structural implementations of the insulated gate bipolar transistor arrangement (e.g.

trench-insulated gate bipolar transistor arrangement or Mesa-insulated gate bipolar transistor arrangement).

The plurality of body areas 380 and the plurality of source areas 385 may be formed within the drift layer 370 by implanting ions and performing subsequent annealing steps. However, the plurality of body areas 380 and the plurality of source areas 385 may occupy only a small portion of the drift layer 370 so that the drift layer 370 comprises mainly the first conductivity type, for example. Alternatively, the plurality of body areas 380 may be deposited on top of the drift layer 370 so that the plurality of body areas 380 may be part of a body layer. Further, the plurality of source areas 385 may be implemented within the body layer by implanting ions and performing subsequent annealing steps.

The collector layer 360, the drift layer 370, the plurality of body areas 380, the plurality of cell areas 385 and the plurality of gates 390 can be arranged in various ways in order to implement an insulated gate bipolar transistor structure. For example, the plurality of source areas 385 and the plurality of gates 390 as well as the electrical connection to this structures is located at the front-side (main surface) of the semiconductor device and the collector layer 360 as well as the electrical contact to the collector layer 360 is arranged at the backside of the semiconductor device as shown in FIG. 3.

The different average densities of free charge carriers within the cell region 110, the carrier confinement reduction region 120 and the sensitive region 130 may be obtained or caused by various measures, which will be explained in the following and may be used independent from each other or by a combination of two or more of these measures.

For example, one or more of these methods may be implemented on the main surface. In this way, a complex backside processing may be avoided, for example.

For example, the source current provided to the cell region 110, the carrier confinement reduction region 120 and the sensitive region 130 may be controlled so that a desired distribution of free charge carriers in an on-state of the insulated gate bipolar transistor arrangement is obtained. In other words, the insulated gate bipolar transistor arrangement may comprise a source current supply circuit. This source current supply circuit may provide in an on-state of the insulated gate bipolar transistor arrangement a first average source current to the source areas located in the cell region, a second average source current to the source areas located in the carrier confinement reduction region 120 and a third average source current to the source areas located in the sensitive region 130. The first average source current is larger than the second average source current and the second average source current is larger than the third average source current. In this way, the first average density of free charge carriers within the cell region can be higher than the second average density of free charge carriers within the carrier confinement reduction region 120 and higher than the average density of free charge carriers within the sensitive region 130.

An average source current may be a current provided to source areas averaged through a region or a current per source area averaged through a region (the cell region, the carrier confinement reduction region or the sensitive region). In other words, the source current within the different regions may be limited so that the average density of free charge carriers is reduced towards the sensitive region 130. The average source current of the sensitive region 130 may also be zero (e.g. no current provided or no source areas implemented), for example.

Alternatively or additionally to a different limitation of the source current, the portion of area occupied or covered by source areas within the cell region 110, the carrier confinement reduction region 120 and/or the sensitive region 130 may be varied. In other words, the source areas located in the cell region 110 may cover a larger portion of the cell area 110 (portion of die area occupied by the source areas) than a portion of the carrier confinement reduction region 120 covered by the source areas located in the carrier confinement reduction region. Further, the source areas located in the sensitive region 130 may cover a smaller portion of the sensitive area 130 than a portion of the carrier confinement reduction region 120 covered by the source areas located in the carrier confinement reduction region 120. By reducing the portion of areas occupied or covered by source areas, the provided source current in the different region can be varied so that a desired distribution of the average density of free charge carriers in an on-state of the insulated gate bipolar transistor arrangement can be obtained. Alternatively, the sensitive region 130 may comprise no source areas of the insulated gate bipolar transistor arrangement so that the average density of free charge carriers within the sensitive region 130 is basically caused by free charge carriers reaching the sensitive region 130 from the carrier confinement reduction region 120.

A variation of the portion of area occupied or covered by the source areas can be obtained by varying the size or the number of the masked or unmasked areas during the source implantation, for example.

Alternatively or additionally to one or more aspects described above, the channel width used for controlling the current flow in an on-state of the insulated gate bipolar transistor arrangement can be varied within the different regions. In other words, an average channel width controllable by the gates located in the cell region 130 may be larger than an average channel width controllable by the gates located in the carrier confinement reduction region 120 and an average channel width controllable by the gates located in the sensitive region 130 may be smaller than an average channel width controllable by the gates located in the carrier confinement reduction region 120. In this way, a significantly lower base current is generated within the sensitive region 130 in comparison with the cell region 110 so that the density of free charge carriers can be significantly lower within the sensitive region 130 than in the cell region 110. Alternatively, the sensitive region 130 may comprise no gates or no channel areas controllable by gates so that the average density of free charge carriers within the sensitive region 130 is basically caused by free charge carriers reaching the sensitive region 130 from the carrier confinement reduction region 120.

Additionally, alternatively or optionally to one or more aspects described above, the channel length used for controlling the current flow in an on-state of the insulated gate bipolar transistor arrangement can be varied within the different regions. In other words, an average channel length controllable by the gates located in the cell region 130 may be smaller than an average channel length controllable by the gates located in the carrier confinement reduction region 120 and an average channel length controllable by the gates located in the sensitive region 130 may be larger than an average channel length controllable by the gates located in the carrier confinement reduction region 120. In this way, a significantly lower base current is generated within the sensitive region 130 in comparison with the cell region 110 so that the density of free charge carriers can be significantly lower within the sensitive region 130 than in the cell region 110.

Additionally, alternatively or optionally to one or more aspects described above, the semiconductor structure may comprise a plurality of trenches reaching vertically (orthogonal to a main surface) through a body layer comprising the plurality of body regions. In other words, the trenches may reach from a main surface of the semiconductor substrate into the semiconductor substrate towards an opposite surface of the semiconductor substrate. Further, the gates are arranged in trenches of the plurality of trenches. By implementing the gates in trenches reaching through the body regions into the drift layer, trench-insulated gate bipolar transistor structures and/or Mesa-insulated gate bipolar transistor structures can be provided.

Figure 4:
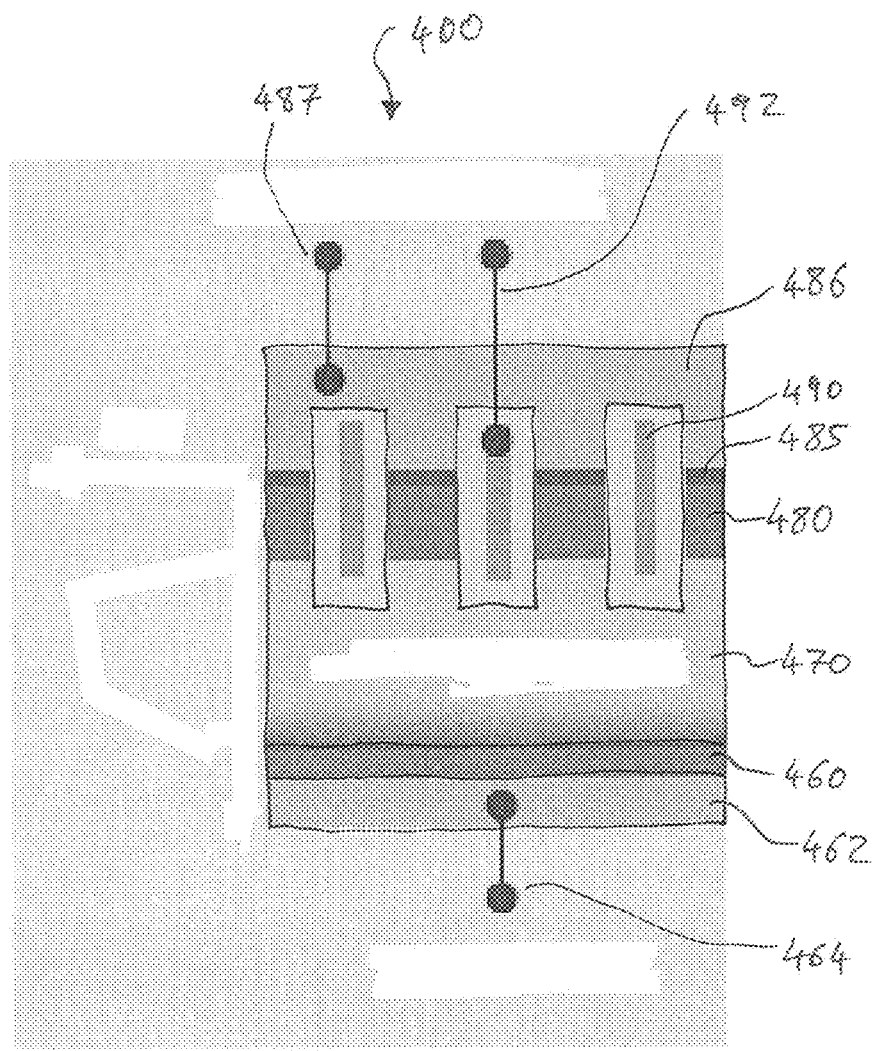
FIG. 4 shows a schematic illustration of a part of a Mesa-insulated gate bipolar transistor arrangement.
Figure 10:
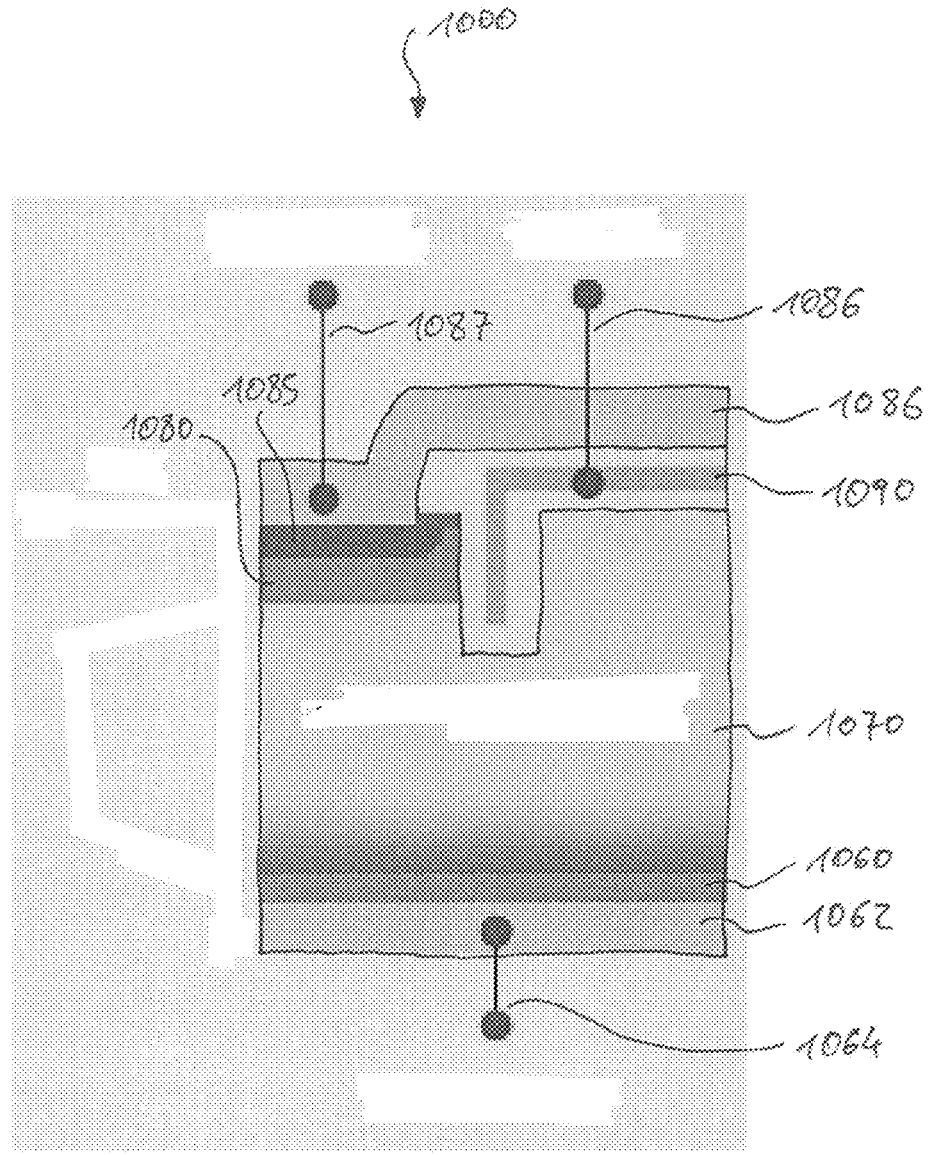
FIG. 10 shows a schematic cross-section of a part of a trench-insulated gate bipolar transistor arrangement.

FIG. 4 and FIG. 10 illustrate an overview of two examples of different cell types.

FIG. 4 shows a schematic cross section of a Mesa-insulated gate bipolar transistor structure 400. The Mesa-insulated gate bipolar transistor structure 400 comprises a collector layer 460 (e.g. doping concentration of 1e16 to 1e18/$cm^2$) and a backside collector metal layer 462 for an electrical contact 464 to the collector layer 460 of the Mesa-insulated gate bipolar transistor structure 400 at a backside of the Mesa-insulated gate bipolar transistor structure 400. Further, the Mesa-insulated gate bipolar transistor structure 400 comprises a drift layer 470 (e.g. n⁻ basis, substrate) adjacent to the collector layer 460 and a body layer (e.g. deposited or implanted) comprising body areas 480 (e.g. doping concentration of 1e17 to 1e19/$cm^2$) adjacent to the drift layer 470 (e.g. doping concentration of 5e12 to 1e14/$cm^2$). Additionally, the Mesa-insulated gate bipolar transistor structure 400 comprises source areas 485 in contact to a source metal layer 486 for an electrical contact 487 adjacent to the body areas 480. Additionally, also the body areas 480 may be in contact to a source metal layer 486, for example. Further, trenches comprising gates 490 (e.g. poly silicon gates) reaching vertically through the body layer are arranged with predefined lateral distance to each other. The gates can be electrically connected through a gate wiring 492 (not shown). Optionally, the Mesa-insulated gate bipolar transistor structure 400 may comprise a field stop layer between the drift layer 470 and the collector layer 460.

The Mesa-insulated gate bipolar transistor structure 400 comprises body areas representing Mesa structures. A Mesa structure comprises a significantly larger (e.g. more than 5 times larger or more than 10 times larger) dimension in one lateral direction than in another lateral direction (e.g. orthogonal lateral direction). A local carrier confinement may be adjusted or varied by varying a lateral width of the Mesa structure (e.g. lateral width of body area), for example. The Mesa-insulated gate bipolar transistor structure 400 may also be called strip-insulated gate bipolar transistor structure for devices with Mesa structures with large lateral width (e.g. more than 5 μm).

Optionally, alternatively or additionally to one or more aspects mentioned above, the plurality of trenches comprises more trenches than gates comprised by the plurality of gates. The remaining trenches can be filled with spacer structures so that the distance between gates can be varied by arranging a different number of spacer structures between two neighbouring gates. In other words, gates may be arranged in a first part of the plurality of trenches and the plurality of spacer structures may be arranged within a second part of the plurality of trenches. Further, the semiconductor device may be configured to connect the plurality of spacer structures to a source potential (e.g. by electrically connecting the spacer structures to the source areas through one or more metal layer) in an on-state of the insulated gate bipolar transistor arrangement. Additionally, an average number of spacer structures between neighbouring gates (e.g. closest neighbours or closest neighbours in a predefined direction) in the cell region may be smaller than an average number of spacer structures between neighbouring gates in the carrier confinement reduction region and an average number of spacer structures between neighbouring gates in the sensitive region may be larger than an average number of spacer structures between neighbouring gates in the carrier confinement reduction region. In this way, the channel area per volume controlled by gates can be varied in order to obtain a desired distribution of the density of free charge carriers. Additionally, an n-barrier layer between the trenches under the p-body region can be used to increase the concentration of free charge carriers. The n-barrier may be implemented in the cell region, whereas, an n-barrier layer with lower doping concentration can be implemented in the carrier confinement reduction region and no n-barrier may be implemented in the sensitive region. Alternatively, different n-barrier doses in the cell region and the sensitive region may also result in different charge carrier densities in front of the mesa structure. In other words, the semiconductor device may comprise a barrier layer at least between the trenches of the cell region and between the trenches of the carrier confinement reduction region. The barrier layer may comprise the first conductivity type. Further, an average doping concentration of the barrier layer within the cell region may be higher than an average doping concentration of the barrier layer within the carrier confinement reduction region.

Figure 5:
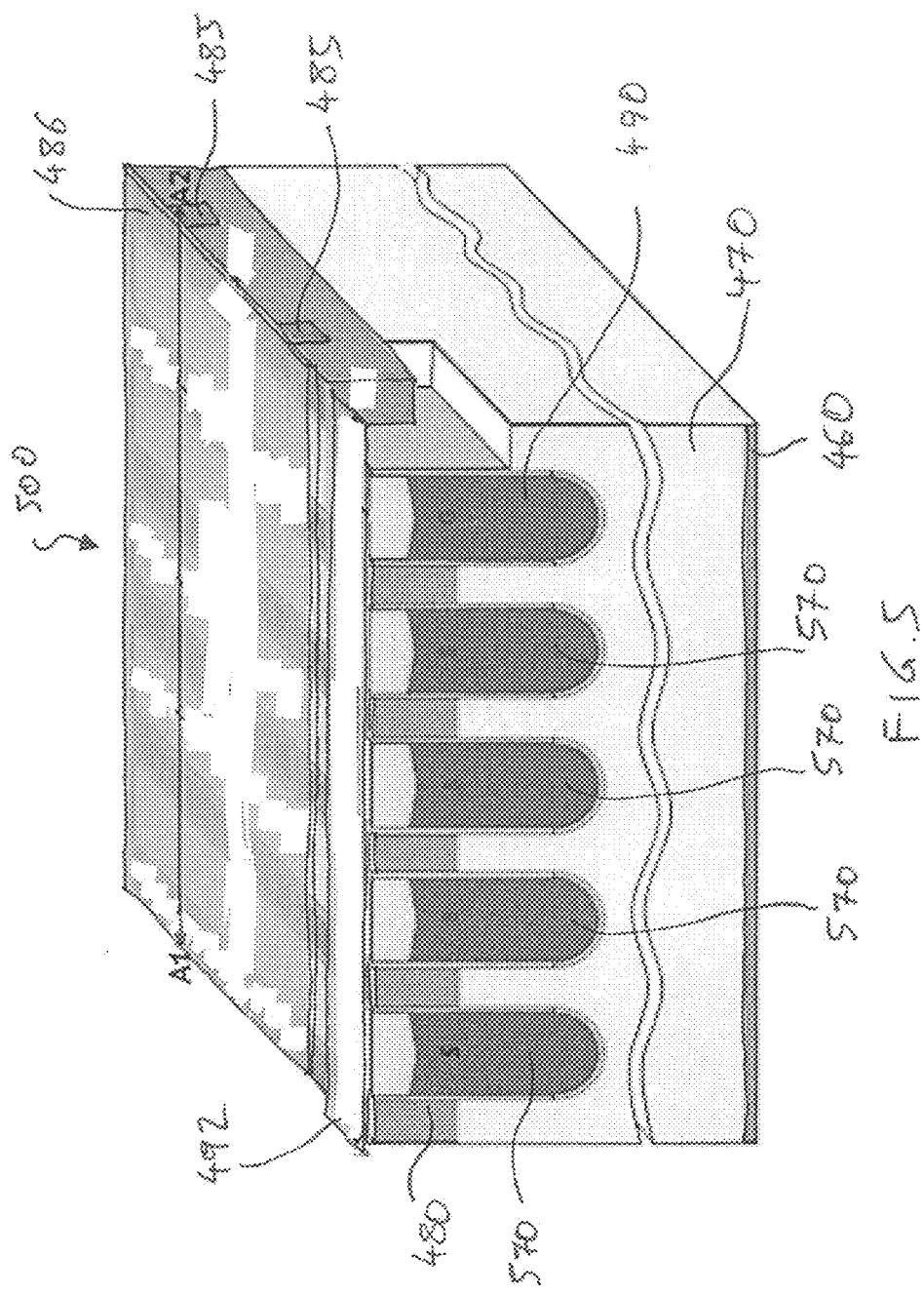
FIG. 5 shows a schematic three-dimensional illustration of a part of a Mesa-insulated gate bipolar transistor arrangement.

FIG. 5 shows a schematic three dimensional view of a Mesa-insulated gate bipolar transistor structure 500. The Mesa-insulated gate bipolar transistor structure 500 is implemented similar to the Mesa-insulated gate bipolar transistor structure shown in FIG. 4, but comprises trenches including spacer structures 570 connected to source potential. The illustrated example comprises a GS4 contacting indicating that a trench containing a gate is laterally followed by four trenches containing a spacer structure 570 (e.g. same material as gates but connected to source).

Figure 6:
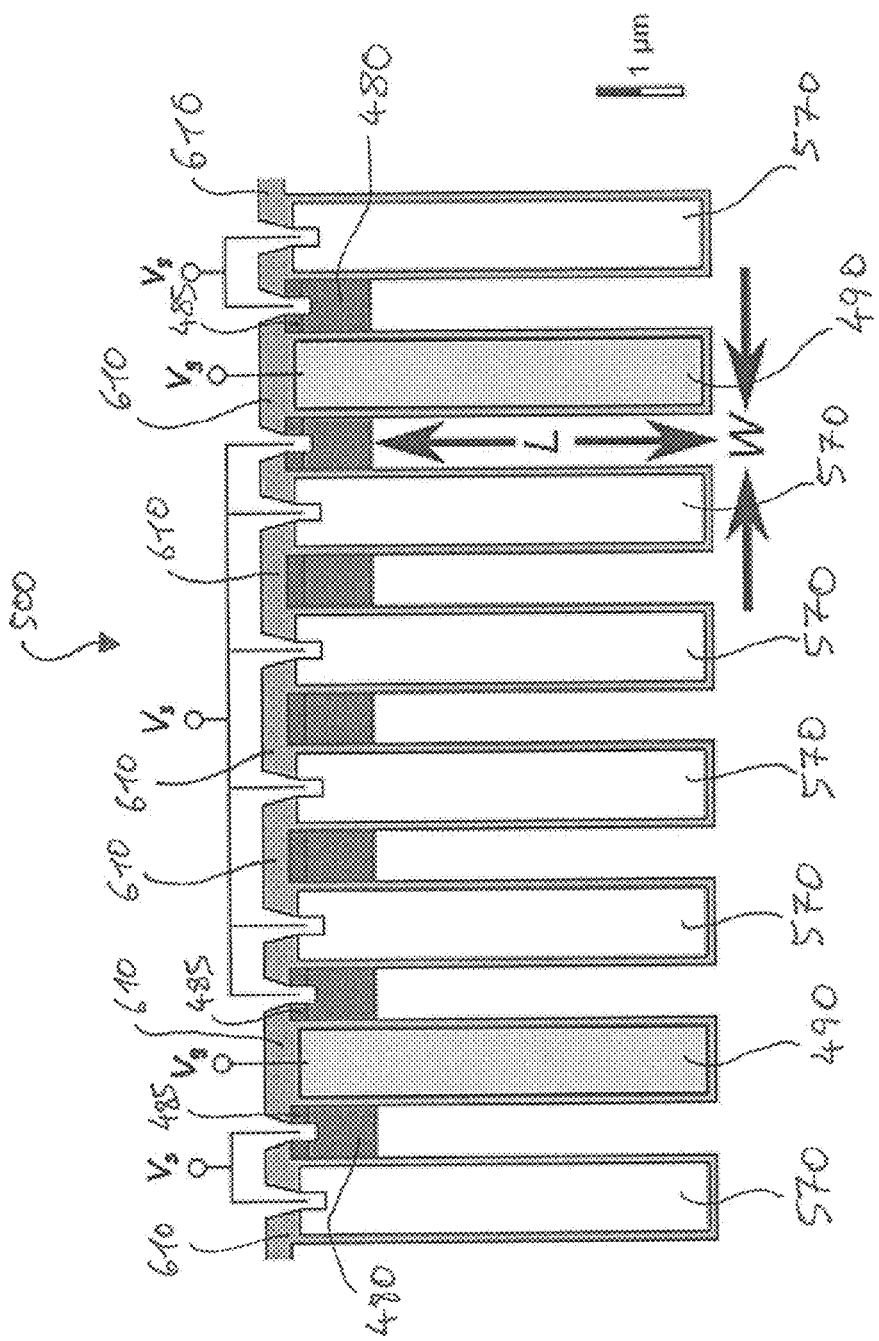
FIG. 6 shows a schematic cross-section of a part of a Mesa-insulated gate bipolar transistor arrangement.

FIG. 6 shows a schematic cross section of the Mesa-insulated gate bipolar transistor structure 500 shown in FIG. 5 along the indicated line A1-A2. The gates 490 are connected or connectable to a gate potential or voltage $V_g$ and the spacer structures 570 are connected or connectable to a source potential or voltage $V_s$ in an on-state of the insulated gate bipolar transistor arrangement. Alternatively, the spacer structures may be connected or connectable also to the gate potential or voltage $V_g$, if the portion of the body layer adjacent to the spacer structures is implemented without source areas 485 so that no channel can be built up. In this way, a more homogeneously high backlash capacity may be provided to the back end (BE). The gates 490 and the spacer structures are electrically insulated from the adjacent semiconductor material by an insulation layer 610 (e.g. silicon oxide). Further, FIG. 6 indicates a Mesa width W and a Mesa height L as well as a possible scale (e.g. indicating m), for example.

Figure 7:
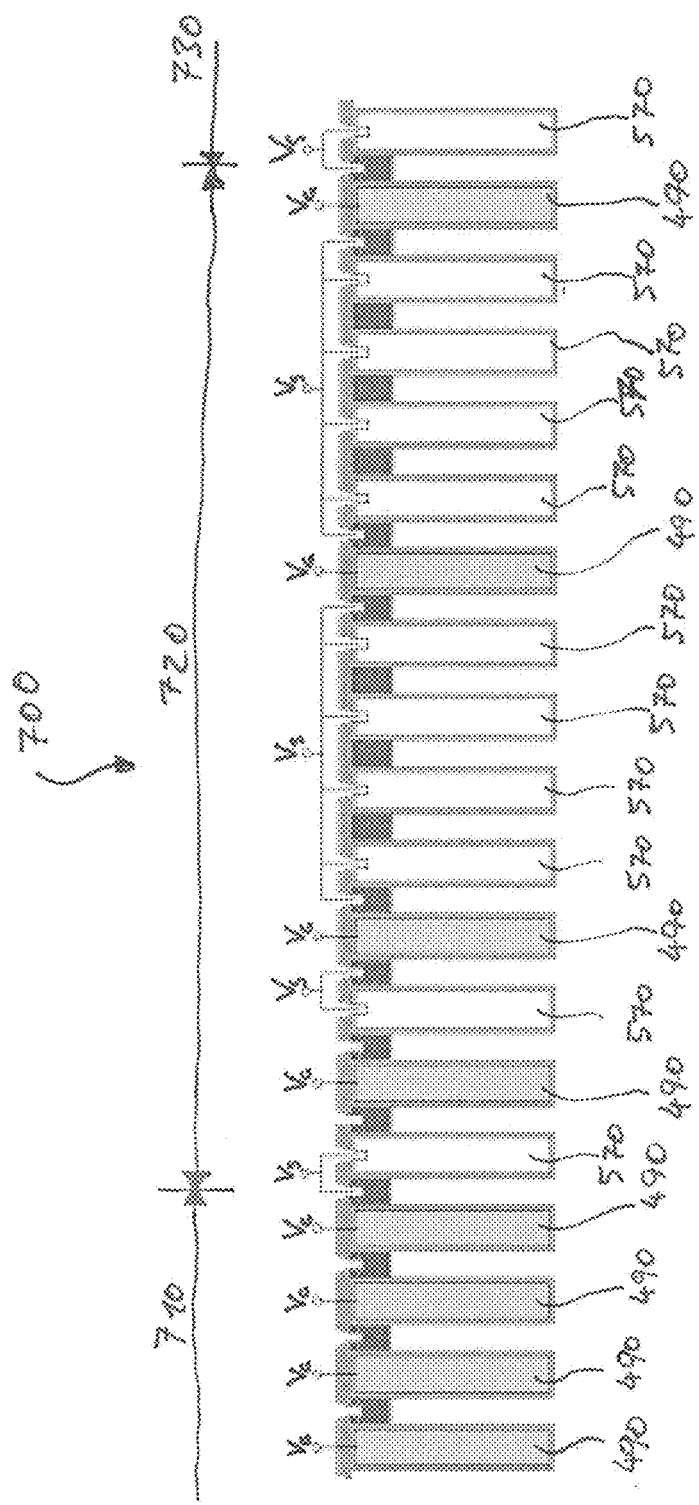
FIG. 7 shows a schematic cross-section of a further part of a Mesa-insulated gate bipolar transistor arrangement.

FIG. 7 shows a schematic cross section of an insulated gate bipolar transistor arrangement 700 according to an embodiment. The insulated gate bipolar transistor arrangement 700 comprises a plurality of Mesa-insulated gate bipolar transistor structures as described above (e.g. FIG. 4-6). In this example, an average number of spacer structures between neighbouring gates in the cell region 710 (e.g. no spacer structures between neighbouring gates) is smaller than an average number of spacer structures between neighbouring gates in the carrier confinement reduction region 720 (e.g. one to four spacer structures between neighbouring gates, increasing towards the sensitive region) and an average number of spacer structures between neighbouring gates in the sensitive region 730 (e.g. only spacer structures or more spacer structures between neighbouring gates than in the carrier confinement reduction region) is larger than an average number of spacer structures between neighbouring gates in the carrier confinement reduction region 720. In this way, the channel area per volume controlled by gates is varied in order to obtain a desired distribution of the density of free charge carriers.

In other words, FIG. 7 shows an example of a Cross-cut through an emitter-structures of an MPT-IGBT. The density of the effectively active cells (cells with trenches connected to Gate-potential) is reduced from left to right resulting in a reduction of source current from left to right. Only the mesas next to the Gate-trenches are connected to source in the figure. A contacting of all mesas is also possible by which the carrier confinement may be reduced in common with the source current (e.g. by a source current supply circuit).

Optionally, additionally or alternatively to one or more aspects described above, the average distance of neighbouring trenches can be varied in order to influence the average density of free charge carriers. In other words, an average distance of neighbouring trenches located in the cell region may be smaller than an average distance of neighbouring trenches located in the carrier confinement reduction region (e.g. comprising a continuously or stepwise increasing distance towards the sensitive region) and an average distance of neighbouring trenches located in the sensitive region may be larger than an average distance of neighbouring trenches located in the carrier confinement reduction region. In the sensitive region it is possible that the trench density is zero, in particular if the sensitive region contains the junction termination, for example.

FIG. 8A shows a schematic cross section of an insulated gate bipolar transistor arrangement 800 according to an embodiment. The insulated gate bipolar transistor arrangement 800 comprises a plurality of Mesa-insulated gate bipolar transistor structures as described above (e.g. FIG. 4-6). In this example, a number of spacer structures between neighbouring gates is constantly one. Further, an average distance of neighbouring trenches located in the cell region 810 (e.g. comprising a smallest distance through the whole cell region) may be smaller than an average distance of neighbouring trenches located in the carrier confinement reduction region 820 (e.g. comprising a continuously or stepwise increasing distance towards the sensitive region) and an average distance of neighbouring trenches located in the sensitive region 830 may be larger than an average distance of neighbouring trenches located in the carrier confinement reduction region 820. In other words, the Mesa width may be increased towards the sensitive region 830. In this way, the channel area per volume controlled by gates and the charge-carrier density (controlled by the confinement effect) is varied in order to obtain a desired distribution of the density of free charge carriers.

In other words, FIG. 8A shows an example of a cross-cut through emitter-structures of an MPT-IGBT. The width of the mesas in the cells is increased from left to right resulting in a decrease of the carrier-confinement from left to right.

FIG. 8B shows a schematic cross section of an insulated gate bipolar transistor arrangement 890 according to an embodiment. The insulated gate bipolar transistor arrangement 890 comprises a plurality of Mesa-insulated gate bipolar transistor structures as described above (e.g. FIG. 4-6). In this example, an average depth of the gates 490 within trenches located in the cell region 840 is larger than an average depth of the gates 490 within trenches located in the carrier confinement reduction region 850 and an average depth of the gates 490 within trenches located in the sensitive region 860 is smaller than an average depth of the gates 490 within trenches located in the carrier confinement reduction region 850. A varying depth of the gates 490 may be implemented by varying the depth of the trenches and/or by varying a thickness of the insulation layer 870 at the bottom of the trenches as shown in FIG. 8B. The thickness of the insulation layer 870 at the bottom of the trenches may be increased (decreasing the depth of the gates within the trenches) continuously or stepwise towards the sensitive region 860 or the thickness of the insulation layer 870 at the bottom of the trenches may be alternated between two or more predefined or fixed thicknesses so that the average depth of the gates is varied as shown in FIG. 8B. The carrier density within the reduction region 850 may be reduced due to the increase of the thickness of the trench bottom insulation layer (e.g. silicon oxide) in comparison to the cell region 840. Further, the carrier confinement may be reduced and the effective channel length may be increased by a thick thickness of the trench bottom insulation layer in the transition region towards the edge, for example.

The variation of the Mesa width can be implemented in two lateral directions over the main surface of a semiconductor device. FIG. 9A-9C show possible lateral geometries of trenches containing gates indicated by the lines within the cell region 910 in the center of the semiconductor devices and the carrier confinement reduction region 920 separating the cell region 910 from an edge region 930 representing a sensitive region. In other words, FIG. 9A-9C show top views of different implementation of trenches (black lines) in a strip-IGBT or Mesa IGBT according to embodiments. All variants comprise an increasing mesa width between the trenches toward the edge so that the carrier confinement effect and consequently the carrier concentration present in an on-state is reduced toward the chip edge (see FIG. 8 for a cross section).

FIG. 10 shows a schematic cross section of a trench-insulated gate bipolar transistor structure 1000. The trench-insulated gate bipolar transistor structure 1000 comprises a collector layer 1060 and a backside collector metal layer 1062 for an electrical contact 1064 to the collector layer 1060 of the trench-insulated gate bipolar transistor structure 1000 at a backside of the trench-insulated gate bipolar transistor structure 1000. Further, the trench-insulated gate bipolar transistor structure 1000 comprises a drift layer 1070 (e.g. n⁻ basis, substrate) adjacent to the collector layer 1060 and body areas 1080 implanted into the drift layer 1070. Additionally, the trench-insulated gate bipolar transistor structure 1000 comprises source areas 1085 in contact to a source metal layer 1086 for an electrical contact 1087 implanted into the body areas 1080. Additionally, also the body areas 1080 may be in contact to a source metal layer 1086, for example. Further, trenches comprising gates 1090 (e.g. poly silicon gates) reaching vertically through the body layer are arranged with predefined lateral distance to each other. The gates can be electrically connected through a gate wiring 1092 (not shown). The structure forming the gates may expand over at least a part of the insulated gate bipolar transistor arrangement connecting a plurality of gates 1090 located in trenches, for example. Optionally, the Mesa-insulated gate bipolar transistor structure 1000 may comprise a field stop layer between the drift layer 1070 and the collector layer 1060.

As already mentioned, the portion of area occupied or covered by source areas within the cell region, the carrier confinement reduction region and/or the sensitive region may be varied.

Figure 11:
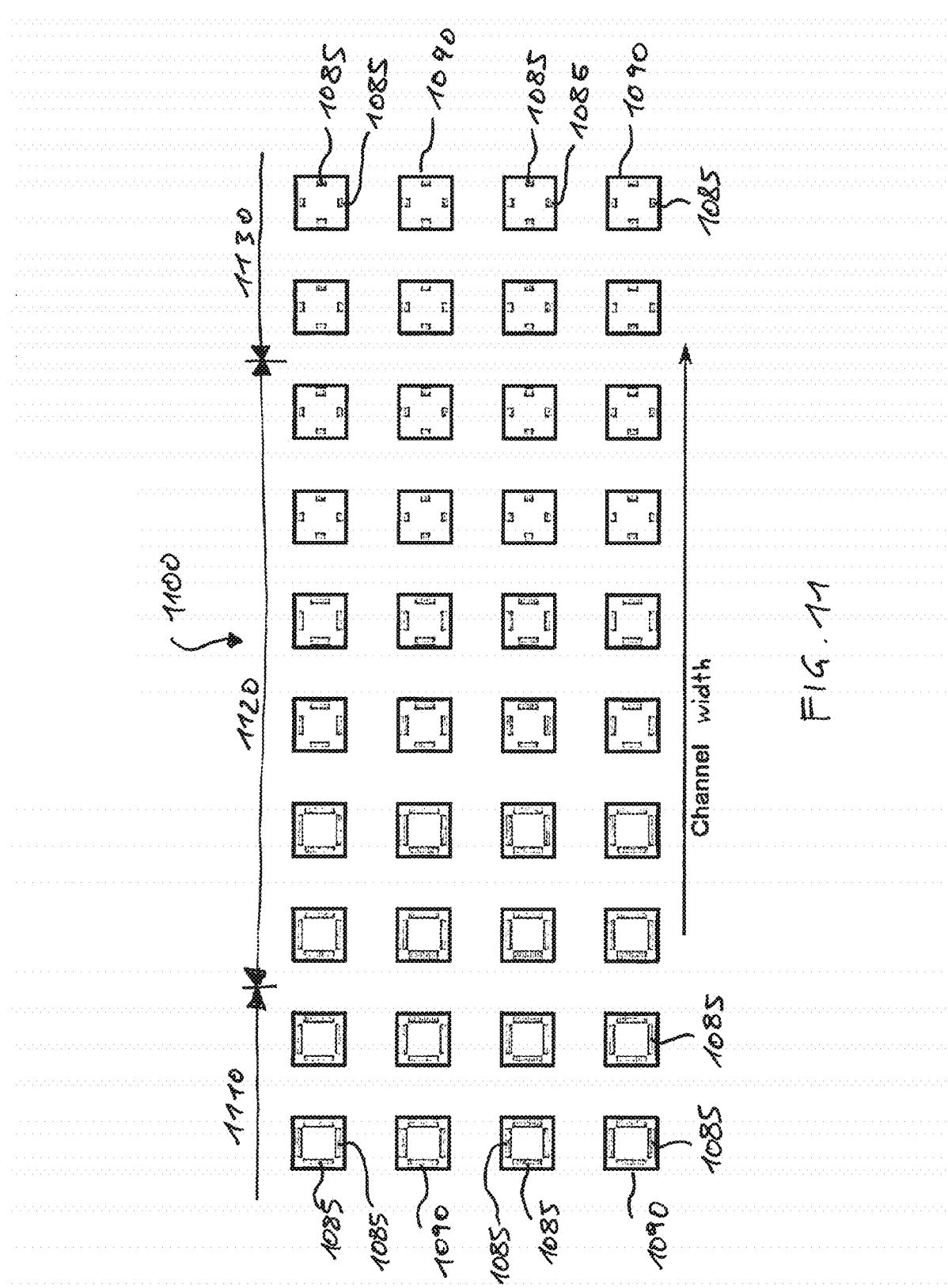
FIG. 11 shows a schematic top view of a part of a trench-insulated gate bipolar transistor arrangement.

FIG. 11 shows a schematic top view of an insulated gate bipolar transistor arrangement 1100 according to an embodiment. The insulated gate bipolar transistor arrangement 1100 comprises a plurality of trench-insulated gate bipolar transistor structures as described above (e.g. FIG. 10). The source areas 1085 located in the cell region 1110 cover a larger portion of the cell area 1110 (portion of die area occupied by the source areas) than a portion of the carrier confinement reduction region 1120 covered by the source areas 1085 located in the carrier confinement reduction region 1120. Further, the source areas 1085 located in the sensitive region 1130 cover a smaller portion of the sensitive area 1130 than a portion of the carrier confinement reduction region 1120 covered by the source areas 1085 located in the carrier confinement reduction region 1120. By reducing the portion of areas occupied or covered by source areas 1085, the provided source current in the different regions can be varied so that a desired distribution of the average density of free charge carriers in an on-state of the insulated gate bipolar transistor arrangement 1100 can be obtained.

In other words, FIG. 11 shows an example of a view on the emitter-structures of a trench IGBT. The channel width per cell (1085 denote the n-source regions, i.e., the active channel area) is reduced from left to right.

Optionally, additionally or alternatively to one or more aspects mentioned above, each trench of the plurality of trenches surrounds a body region of the plurality of body regions. In this way, a trench insulated gate bipolar transistor structure may be implemented. In this case, the carrier confinement may be varied by a variation of the average distance of neighbouring body regions surrounded by trenches, for example. In other words, an average distance (e.g. averaged through the respective region) of neighbouring body regions (e.g. closest neighbour or closest neighbour in a predefined direction) surrounded by trenches located in the cell region may be smaller than an average distance of neighbouring body regions surrounded by trenches located in the carrier confinement reduction region and an average distance of neighbouring body regions surrounded by trenches located in the sensitive region may be larger than an average distance of neighbouring body regions surrounded by trenches located in the carrier confinement reduction region. By increasing the distance of possible current sources towards the sensitive region, the average density of free charge carriers can be reduced towards the sensitive region. Alternatively, the sensitive region may comprise no body region surrounded by trenches (so that the average distance is infinite).

Figure 12:
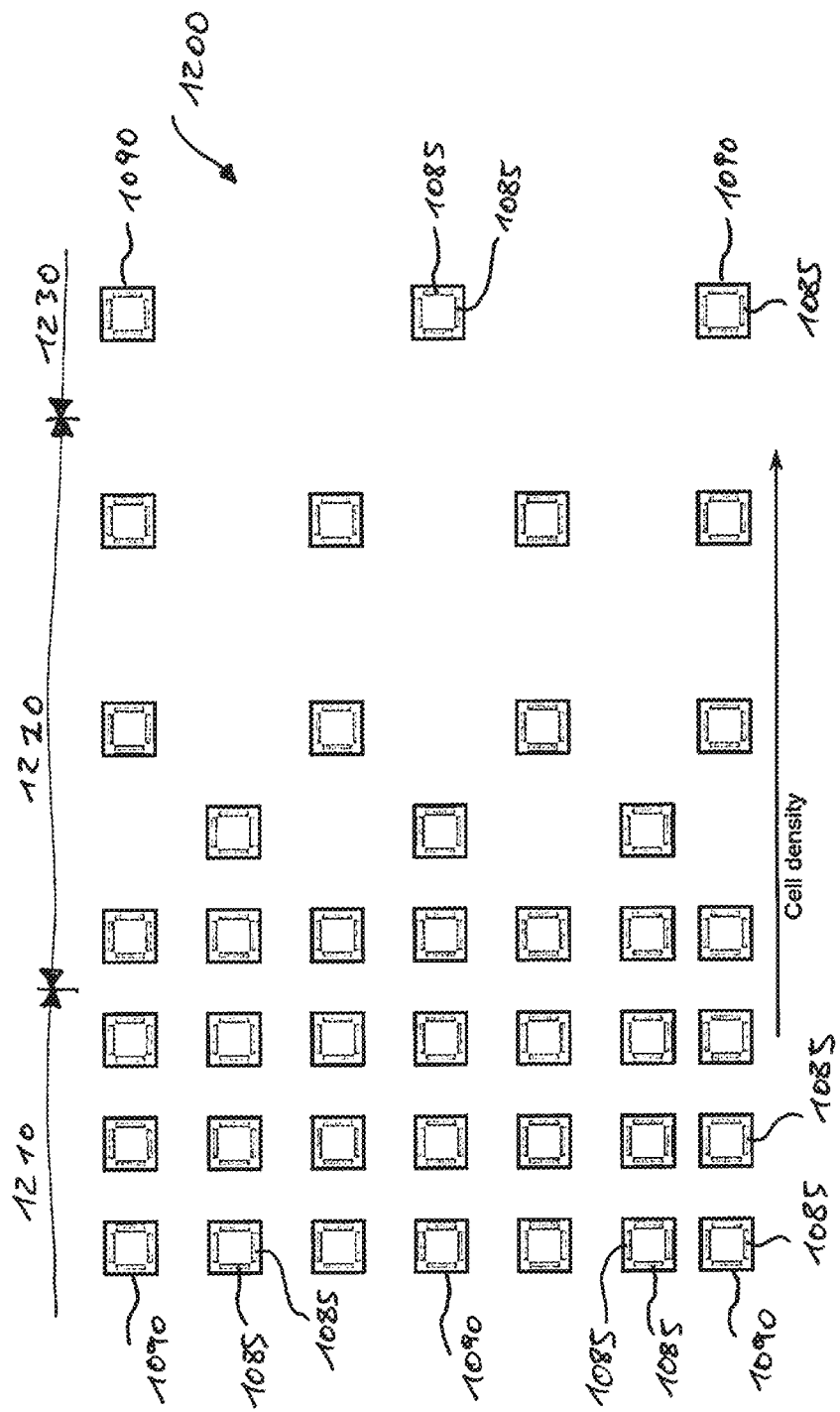
FIG. 12 shows a schematic top view of a part of a further trench-insulated gate bipolar transistor arrangement.

FIG. 12 shows a schematic top view of an insulated gate bipolar transistor arrangement 1200 according to an embodiment. The insulated gate bipolar transistor arrangement 1200 comprises a plurality of trench-insulated gate bipolar transistor structures as described above (e.g. FIG. 10). An average distance (e.g. averaged through the respective region) of neighbouring body regions (e.g. closest neighbour or closest neighbour in a predefined direction) surrounded by trenches 1090 located in the cell region 1210 may be smaller than an average distance of neighbouring body regions surrounded by trenches 1090 located in the carrier confinement reduction region 1220 and an average distance of neighbouring body regions surrounded by trenches 1090 located in the sensitive region 1230 may be larger than an average distance of neighbouring body regions surrounded by trenches 1090 located in the carrier confinement reduction region 1220. By increasing the distance of possible current sources 1085 towards the sensitive region 1230, the average density of free charge carriers can be reduced towards the sensitive region 1230.

In other words, FIG. 12 shows a view on the emitter-structures of a trench IGBT. The density of the cells is reduced from left to right.

Optionally, additionally or alternatively to one or more aspects mentioned above, the depth of the trenches can be varied in order to influence the carrier confinement laterally. In other words, an average depth of trenches located in the cell region may be larger than an average depth of trenches located in the carrier confinement reduction region and an average depth of trenches located in the sensitive region may be smaller than an average depth of trenches located in the carrier confinement reduction region. Trenches reaching deep into the drift layer may cause a larger carrier confinement or density of free charge carriers in an on-state than trenches reaching only slightly through the body areas. Therefore, the average density of free charge carriers can be reduced towards the sensitive region by reducing the depth of the trenches. Alternatively, the sensitive region may comprise no trenches containing gates (e.g. resulting in an average depth of zero).

For example, the depth of the trenches within the cell region is constant (neglecting manufacturing variations) and is continuously or stepwise reduced within the carrier confinement reduction region towards the sensitive region, for example.

Figure 13:
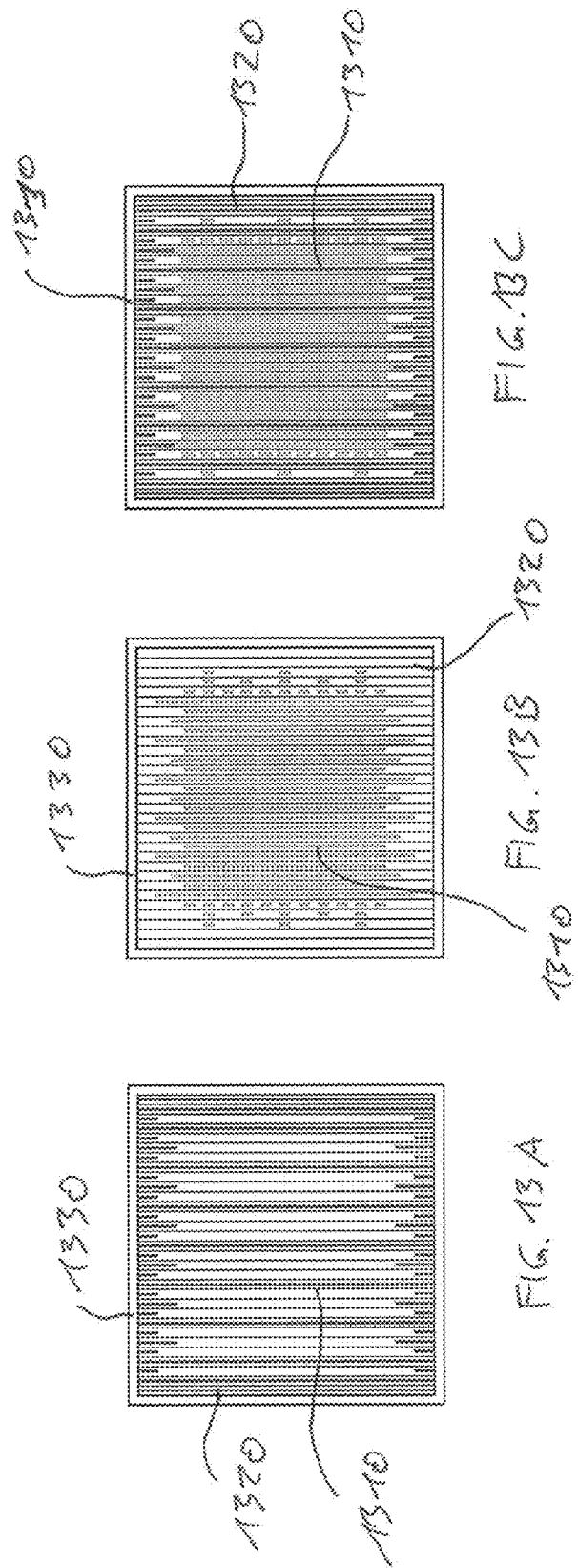
FIG. 13A shows a schematic top view of a semiconductor device with indicated Mesa conducting positions.
FIG. 13B shows a schematic top view of a semiconductor device with indicated source implant.
FIG. 13C shows a schematic top view of a semiconductor device by a combination of the semiconductor device shown in FIGS. 13A and 13B.

FIG. 13A shows a top view of a possible Mesa contacting. The cell region 1310 comprises a lower contact hole density for contacting Mesas than the carrier confinement reduction region 1320 separating the cell region 1310 and the sensitive region 1330. The stripes represent openings of the cover oxide between Mesas and the emitter contact. The carrier confinement effect can be reduced by the increase of the contact hole density towards the chip edge 1330 causing a reduction of the storage charges within the device present in the on-state. Alternatively, a reduction or lowering of the contact hole density from the centre of the die to the edge region can be implemented in order to reduce the channel width towards the edge without an n-source shadowing.

FIG. 13B shows a top view of a possible source implantation. The cell region 1310 comprises a higher average source implant area than the carrier confinement reduction region 1320 separating the cell region 1310 and the sensitive region 1330. The stripes represent implanted source areas. The present storage charges within the device can also be reduced by the reduction of the MOS (metal oxide semiconductor) channel width in the direction toward the chip edge 1330.

FIG. 13C shows a top view of a possible Mesa contacting and a possible source implantation according to a combination of the embodiments shown in FIG. 13A and FIG. 13B.

Figure 14:
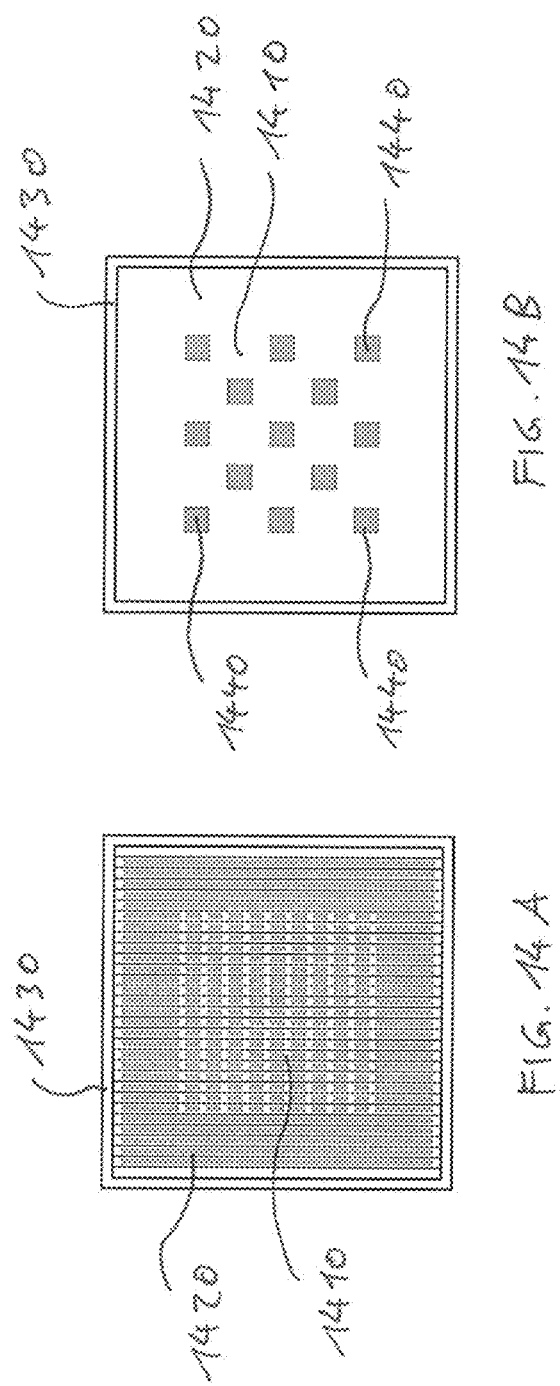
FIG. 14A shows a schematic top view of a semiconductor device with indicated source implant regions.
FIG. 14B shows a schematic top view of the backside of the semiconductor device shown in FIG. 14A with indicated ohmic contact regions.

FIG. 14A shows a top view of a front side and FIG. 14B of a back side of a reverse conducting insulated gate bipolar transistor (RC-IGBT) with a structuring of an MOS channel width according to an embodiment. The stripes shown in FIG. 14A represent implanted source regions. The squares 1440 in FIG. 14B represent n-conducting ohmic contact regions between the n-conducting drift region of the device and the collector or cathode contact (shorts). The current density distribution in an on-operating state of the device can be homogenized by the increase of the MOS channel width in the region with shorts. In this example, the cell region 1410 comprises the shorted areas 1440 while the carrier confinement reduction region 1420 and the sensitive region 1430 do not comprise shorts.

Optionally, alternatively or additionally to one or more aspects mentioned above, the backside collector layer may be adapted so that the current flow from the source areas to the collector layer may mainly occur in the cell region. In other words, the collector layer may comprise a first average dopant density in the cell region and a second average dopant density in the sensitive region. The first average dopant density may be higher than the second dopant density. Additionally, the collector area may optionally comprise an average dopant density in the carrier confinement reduction region between the first average dopant density and the second average dopant density. In this way, the carrier confinement can be reduced towards the sensitive region.

Figure 15:
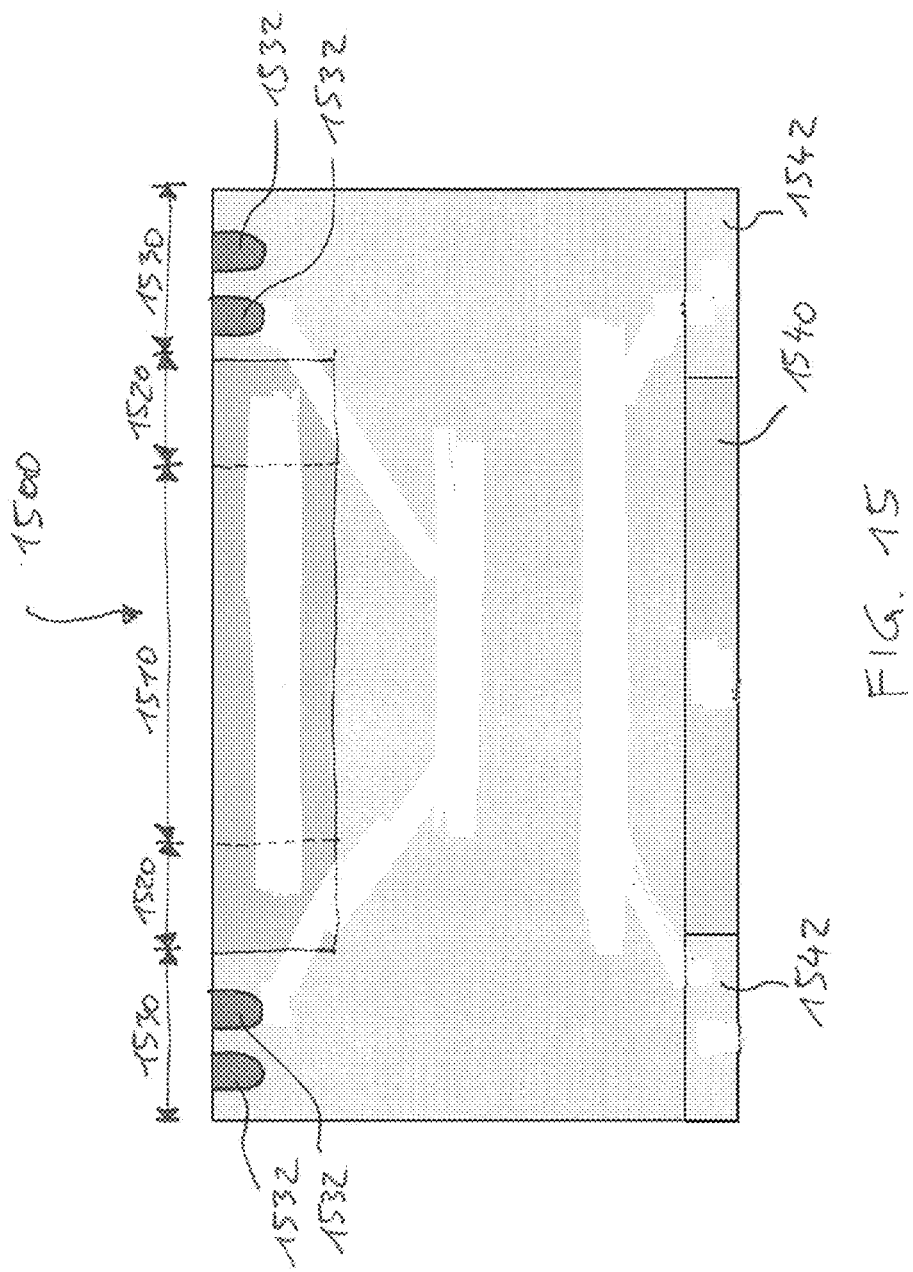
FIG. 15 shows a schematic cross-section of a semiconductor device.

FIG. 15 shows a schematic cross section of a semiconductor device 1500 according to an embodiment. The semiconductor device 1500 comprises insulated gate bipolar transistor structures (area with IGBT cells) within the cell region 1510 and the carrier confinement reduction region 1520 according to one or more embodiments described above. Further, the semiconductor device 1500 comprises an edge region representing a sensitive region 1530 at the edge of the semiconductor device 1500 comprising a plurality of edge termination structures 1532 for reducing an electrical field towards the edge. Further, the backside collector layer comprises a first average dopant density 1540 (e.g. p$^+$) in the cell region 1510 and the carrier confinement reduction region 1520 and a second average dopant density 1542 (e.g. p) in the sensitive region 1530 (weakly doped emitter regions). The first average dopant density 1540 is higher than the second dopant density 1542.

FIG. 15 illustrates an example of a cross section through an insulated gate bipolar transistor and edge and shows a schematic edge termination including an opposite reduced p-emitter doping. This may keep the carrier flooding low, for example.

In some embodiments, the collector layer may comprise reverse conducting regions reaching through the collector layer to the drift layer and comprising the first conductivity type. In this way, reverse conducting insulated gate bipolar transistor (RC-IGBT) with improved durability may be provided.

Figure 16:
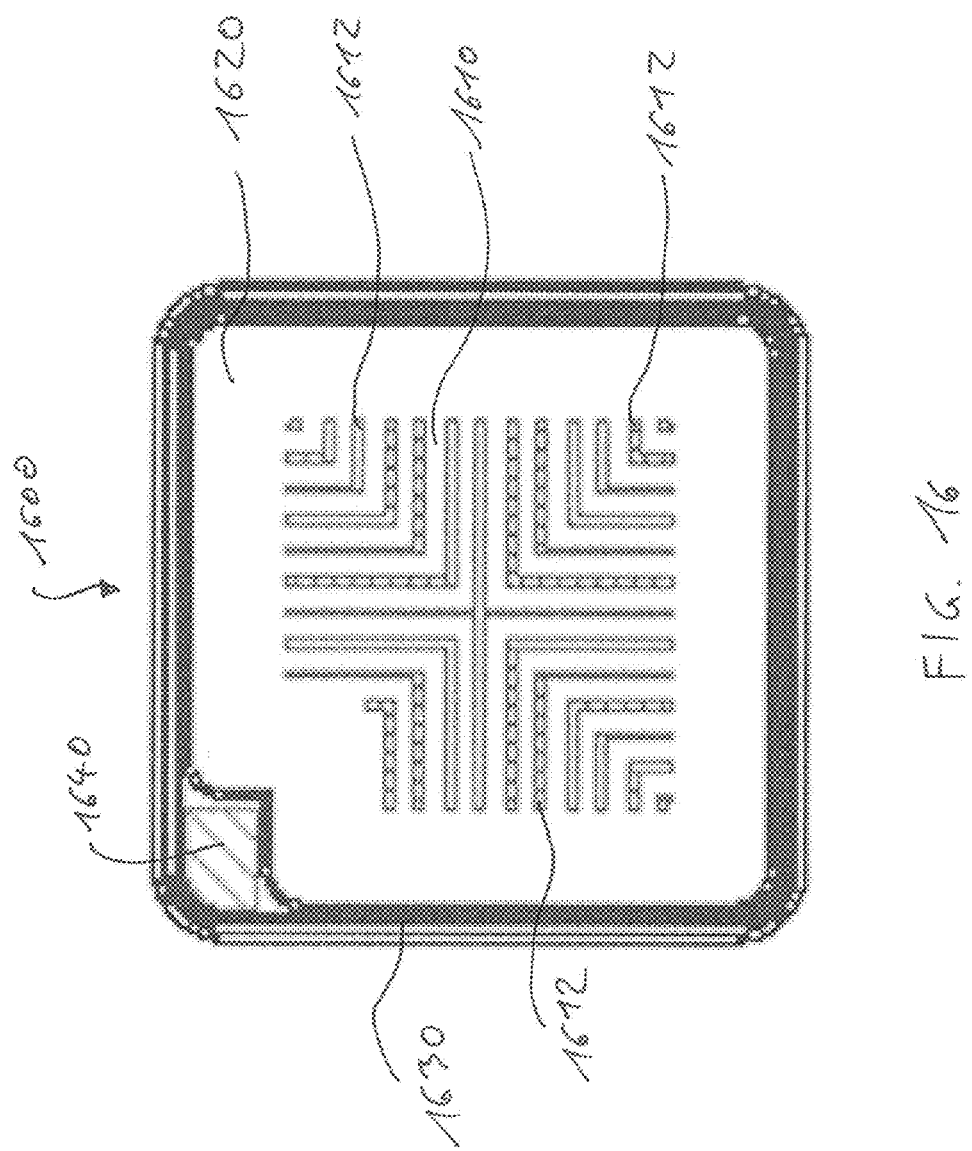
FIG. 16 shows a schematic top view of a backside of a semiconductor device.

FIG. 16 shows a schematic backside view of a reverse conducting insulated gate bipolar transistor structure 1600 (RC-IGBT). The insulated gate bipolar transistor structure 1600 comprises reverse conducting regions 1612 within the cell region 1610 reaching through the collector layer to the drift layer and comprising the same conductivity type as the drift layer. The cell region 1610 is surrounded by a carrier confinement reduction region 1620 comprising no reverse conducting regions. The reverse conducting insulated gate bipolar transistor structure 1600 is surrounded by an edge region 1630 representing a sensitive region. Further, a gate pad 1640 is arranged in the proximity of a corner of the reverse conducting insulated gate bipolar transistor structure 1600.

FIG. 16 shows a layout of a backside mask indicating n+-stripes in the middle 1610. An extensive p-pilot-region 1620 can be arranged in the proximity of the edge at the backside, which may enable as snapback free characteristic.

Figure 17:
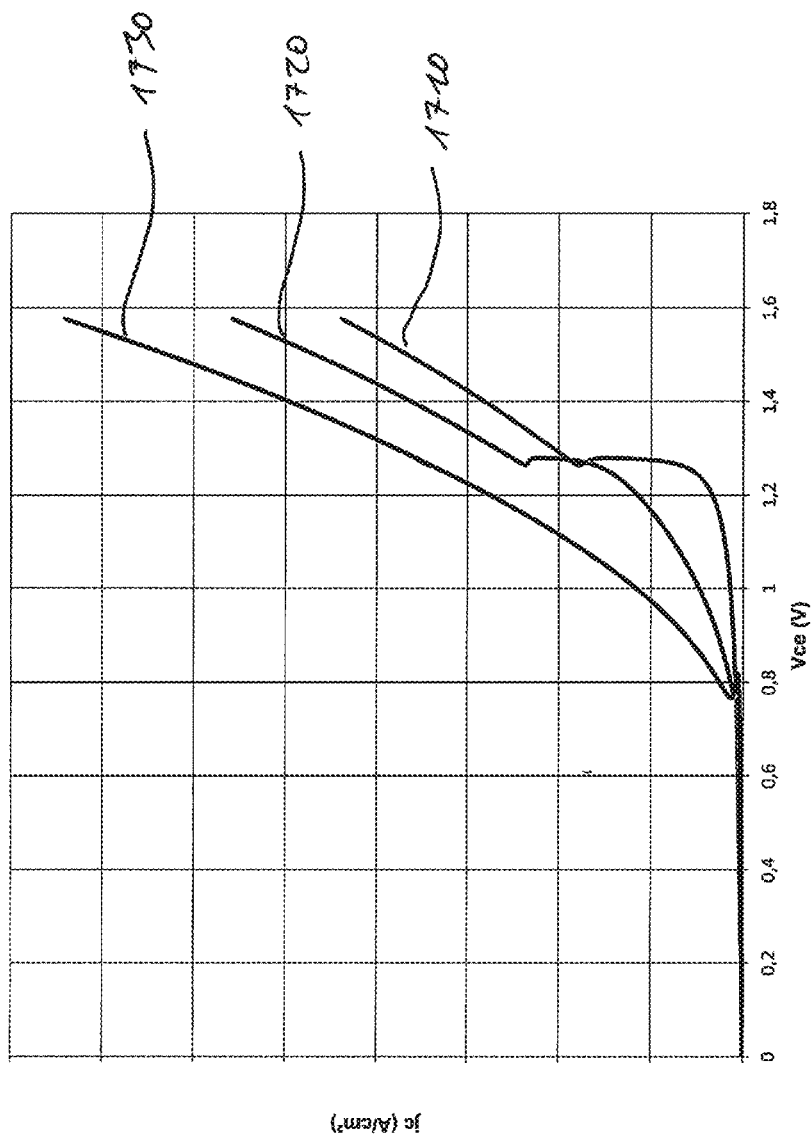
FIG. 17 shows a diagram indicating a current density over a collector emitter voltage of a semiconductor device with homogenous source implants.
Figure 18:
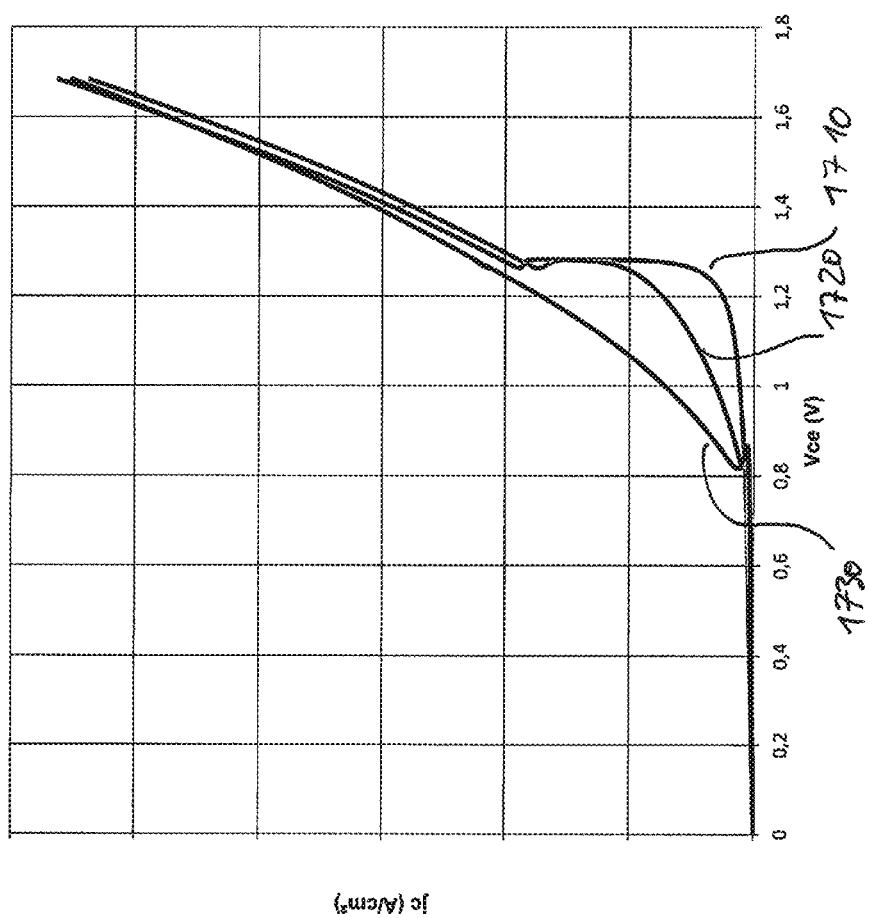
FIG. 18 shows a diagram indicating a current density over a collector emitter voltage of a semiconductor device with inhomogeneous source implants.

FIG. 17 shows a current density $J_c$ over voltage $V_{ce}$ characteristic of a device with homogeneous n$^+$ regions and FIG. 18 shows a current density $J_c$ over voltage $V_{ce}$ characteristic of a device with inhomogeneous n$^+$ regions. A current density of an average diode area 1710, an average p-pilot region 1720 and a total current density 1730 is illustrated.

The average values of the current density within the regions (e.g. FIG. 17) show that the p$^+$-stripe has ignited in the region of nominal current density. However, the mean current density in the region of the stripes (diode area) is significantly lower than in the p-pilot-region. The source sided emitter efficiency within the p-pilot-region may be partly lowered or reduced in order to homogenize the current density and in this way the heating over the whole active area. For example, the n$^+$ implantation was partly removed or the n-stripes have been chosen smaller compared to the p-pilot-region for the simulation structure. This may result in an equal mean current density in the diode region and in the p-pilot (e.g. FIG. 18).

FIG. 19 shows a flowchart of a method 1900 for forming a semiconductor device according to an embodiment. The method 1900 comprises forming 1910 an insulated gate bipolar transistor arrangement. The insulated gate bipolar transistor arrangement comprises a carrier confinement reduction region laterally arranged between a cell region and a sensitive region. The insulated gate bipolar transistor arrangement is formed so that the cell region comprises a first average density of free charge carriers, the carrier confinement reduction region comprises a second average density of free charge carriers and the sensitive region comprises a third average density of free charge carriers in an on-state of the insulated gate bipolar transistor arrangement. The first average density of free charge carriers is larger than the second average density of free charge carriers and the second average density of free charge carriers is larger than the third average density of free charge carriers.

Some embodiments relate to an insulated gate bipolar transistor device with a lateral variation of the emitter zone to provide a means for lateral optimization or improvement of the current and plasma density. A structure and a method may be provided enabling a reduction of hole currents in the transition region (e.g. at insulated gate bipolar transistors, which comprise small Mesa structures at the front side), which allow an increased carrier confinement in the cell region and consequently may lead to a reduced on-state loss or conduction loss.

For example, the width of the front side Mesa structures of so-called Mesa-insulated gate bipolar transistors (Mesa-IGBT) within the transition region (carrier confinement reduction region) between cell field (cell region) and edge termination (sensitive region) can be increased stepwise in order to reduce the carrier confinement in the region of the Mesa areas in this transition region. By this design measure (e.g. causing no or negligible additional process effort), the flooding within the transition region can be efficiently reduced (e.g. without local omission or lowering of the backside emitter). The proposed measure may provide good results, since the backside emitter of so-called Mesa-insulated gate bipolar transistors may be significantly lower doped in comparison to other insulated gate bipolar transistors in order to reach similar switching losses despite the front side obtained carrier confinement, for example. An example for the proposed principal is shown in FIG. 8.

FIG. 8 shows a cross cut through an emitter structure of a micro pattern trench-insulated gate bipolar transistor (MPT-IGBT), for example. The width of the Mesas in the cells is increased from left to right resulting in a decrease of the carrier confinement (i.e. average density of free charge carriers) from left to right (e.g. FIG. 9A to 9C show possible top views of the proposed layout). The shape of the Mesa structures can comprise various geometries (e.g. stripes, islands, circles or similar). Alternatively, the cell pitch may be kept constant (e.g. for a kGkS4-cell, where k denotes a contacted Mesa and G and S denote gate and source trenches respectively) with increasing contacting of the source Mesas from left to right (e.g. kGkSSSS-kGkSkSSS-kGkSkSkSS-kGkSkSkSkSkS). An example is shown in FIG. 7.

The Mesa width of insulated gate bipolar transistors in the proximity of the edge termination may be enlarged in order to lower the flooding with free charge carriers in an on-state or conducting state and consequently to reduce the carrier confinement during the switching off procedure or shutdown. The proposed concept or method can be used for reverse blocking as well as reverse conducting insulated gate bipolar transistors, for example. Also further proposed design measures may be implemented additionally or alternatively in order to obtain a desired or aimed variation of the flooding.

The proposed method may be implemented also in other device areas, which may lead to an increased hole current density during the shutdown procedure or switching off procedure (e.g. the region below the gate pad or below the gate wiring).

According to an aspect, methods leading to an increase of the charge carrier density at the front-side may be intentionally weakened or reduced in the transition region towards parasitic regions (e.g. edge terminations or gate pads or gate wiring) in order to lower or reduce the concentration of free charge carriers within this region efficiently.

For example, it is also possible for reverse conducting insulated gate bipolar transistors (RC-IGBT) to implement another Mesa width or also other additional or alternatively proposed design measures in the region of the so-called ignition structure (which comprises over a certain area region no highly n-doped shorts at the backside in order to provide a sufficient ignition expansion) than in a region, which comprises the shorts in order to obtain or enable a homogenization of the device properties. A large area three-dimensional (3D) structure can be build-up in order to demonstrate this by means of device simulation (e.g. FIG. 16). The front-side trench structure can be replaced by a homogenously doped $n^+$-region (for the simulation). FIG. 16 shows a layout of a backside mask indicating n+-stripes in the middle. $p^+$-stripes are arranged between the $n^+$-stripes and between the striped region and the edge is a $p^+$-pilot-region arranged. An extensive p-pilot-region can be arranged in the proximity of the edge at the backside, which may enable as snapback free characteristic. There is a $p^+$-stripe at the right half (towards the centre of the device), which injects holes in the IGBT-mode, and an $n^+$-stripe, which injects electrons in the diode mode. The average values of the current density within the regions (e.g. FIG. 17) show that the $p^+$-stripe has ignited in the region of nominal current density. However, the mean current density in the region of the stripes (diode area) is significantly lower than in the p-pilot-region. The source sided emitter efficiency within the p-pilot-region may be partly lowered or reduced in order to homogenize the current density and in this way the heating over the whole active area. For example, the $n^+$ implantation was partly removed or the n+-stripes were fabricated with smaller lateral dimensions compared to the p-pilot-region for the simulation structure. This may result in an equal mean current density in the diode region and in the p-pilot (e.g. FIG. 18). The cross ignition into the p-stripes may be promoted in this configuration, since the low current density is larger in the ignition region. $V_{ce,sat}$ is larger in this configuration, since the active area in the IGBT-mode is effectively reduced in this configuration, for example. By a moderate lowering or reduction of the source sided emitter efficiency ($n^+$ doping in the simulation structure), the $V_{ce,sat}$-increase can be kept within a limit. The selected configuration may depend on the operation of the RC-IGBT (e.g. frequency, feedback mode), for example.

The described reduction of the Mesa width may also be combined with a local reduction of the backside emitter efficiency in the edge region of the device in order to increase the effectiveness of the proposed measure. For this, the doping height or doping concentration of the backside emitter can be reduced or alternatively or additionally a doping of an optionally existing field stop zone in the edge region can be increased or alternatively or additionally, an intended reduction of the lifetime of free charge carriers can be implemented by irradiation techniques (e.g. light ions or electrons) or diffusing heavy metal (ions) into the semiconductor material.

In other words, an additional measure to counteract the raised hole currents is an omission of the backside emitter in the edge region. However, this measure may require a backside photo technique, which may cause high efforts and costs, especially for wafer thicknesses used for IGBTs, which comprise a blocking voltage in the range of 400 V to 1700 V, for example. Also the reverse blocking capability may be affected at these structures. The proposed front-side measures may be implemented without the necessity of a backside photo technique.

Additionally (or alternatively) an intended reduction of the source zone width and/or the source zone length or also an omission of source zone regions in the transition region can be implemented in order to reduce the injection of free charge carriers in the transition regions at one hand and also to avoid a switching on of the parasitic npn-transistor (i.e. latch-up) at high current densities and high operation temperatures (e.g. which may lead to an increased cross resistance of the p regions arranged below the source zone).

Further, additionally or alternatively, a variation of the cell pitch (e.g. distance of trenches) within the transition region (carrier confinement reduction region) can be implemented.

It may also be possible to obtain a homogenization of the temperature distribution within the IGBT-chip by the proposed design measures, if a higher current density is reached or intended in the better cooled regions than in the less cooled regions.

The lateral expansion of the transition regions (carrier confinement reduction regions) between the active cell field (cell region) and the edge termination (example for a sensitive region) can be coupled to the diffusion length $L_d$ of the charge carriers, ca. 0.5 to two times $L_d$. In IGBTs without lifetime reduction, the diffusion length may be limited by the device thickness, ca. 0.5 to two times the thickness, for example.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F) PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device comprising an insulated gate bipolar transistor arrangement, wherein the insulated gate bipolar transistor arrangement comprises a semiconductor structure comprising a collector layer, a drift layer, a plurality of body areas, a plurality of source areas and a plurality of gates, wherein the plurality of source areas and the drift layer comprise at least mainly a first conductivity type, wherein the plurality of body areas and the collector layer comprise at least mainly a second conductivity type, wherein the plurality of gates are arranged so that the gates are capable of causing a conductive channel between the source areas and the drift layer through the body areas, wherein the insulated gate bipolar transistor arrangement further comprises a carrier confinement reduction region laterally arranged between a cell region and a sensitive region, wherein the insulated gate bipolar transistor arrangement is configured so that the cell region comprises a first average density of free charge carriers, the carrier confinement reduction region comprises a second average density of free charge carriers and the sensitive region comprises a third average density of free charge carriers in an on-state of the insulated gate bipolar transistor arrangement, wherein the first average density of free charge carriers is larger than the second average density of free charge carriers and the second average density of free charge carriers is larger than the third average density of free charge carriers.

2. The semiconductor device according to claim 1, wherein the carrier confinement reduction region comprises a density of free charge carriers in an on-state of the insulated gate bipolar transistor arrangement decreasing from a border to the cell region to a border of the sensitive region.

3. The semiconductor device according to claim 1, wherein the carrier confinement reduction region comprises a lateral width of less than twice a diffusion length of free charge carries in the carrier confinement reduction region or less than twice a thickness of the semiconductor device.

4. The semiconductor device according to claim 1, wherein the carrier confinement reduction region comprises a lateral width of more than half of a diffusion length of free charge carries in the carrier confinement reduction region or more than half of a thickness of the semiconductor device.

5. The semiconductor device according to claim 1, wherein the sensitive region is an edge region surrounding the semiconductor device, a pad region, a gate wiring region or a thermally endangered region.

6. The semiconductor device according to claim 1, wherein the carrier confinement reduction region laterally surrounds the cell region or the sensitive region.

7. The semiconductor device according to claim 1, comprising more than one sensitive region laterally separated from the cell region by at least one carrier confinement reduction region.

8. The semiconductor device according to claim 1, wherein the cell region comprises the first average density of free charge carriers within the drift layer in an on-state of the insulated gate bipolar transistor arrangement, the carrier confinement reduction region comprises the second average density of free charge carriers within the drift layer in an on-state of the insulated gate bipolar transistor arrangement and the sensitive region comprises the third average density of free charge carriers within the drift layer in an on-state of the insulated gate bipolar transistor arrangement.

9. The semiconductor device according to claim 1, wherein the insulated gate bipolar transistor arrangement comprises a source current supply circuit configured to provide in an on-state of the insulated gate bipolar transistor arrangement a first average source current to the source areas located in the cell region, a second average source current to the source areas located in the carrier confinement reduction region and a third average source current to the source areas located in the sensitive region, wherein the first average source current is larger than the second average source current and the second average source current is larger than the third average source current.

10. The semiconductor device according to claim 1, wherein the source areas located in the cell region cover a larger portion of the cell region than a portion of the carrier confinement reduction region covered by the source areas located in the carrier confinement reduction region and the source areas located in the sensitive region cover a smaller portion of the sensitive area than a portion of the carrier confinement reduction region covered by the source areas located in the carrier confinement reduction region.

11. The semiconductor device according to claim 1, wherein an average channel width controllable by the gates located in the cell region is larger than an average channel width controllable by the gates located in the carrier confinement reduction region and an average channel width controllable by the gates located in the sensitive region is smaller than an average channel width controllable by the gates located in the carrier confinement reduction region.

12. The semiconductor device according to claim 1, wherein the semiconductor structure comprises a plurality of trenches reaching vertically through a body layer comprising the plurality of body regions, wherein the gates are arranged in trenches of the plurality of trenches.

13. The semiconductor device according to claim 12, wherein an average depth of trenches located in the cell region is larger than an average depth of trenches located in the carrier confinement reduction region.

14. The semiconductor device according to claim 12, wherein an average depth of the gates within trenches located in the cell region is larger than an average depth of the gates within trenches located in the carrier confinement reduction region.

15. The semiconductor device according to claim 12, wherein an average distance of neighboring trenches located in the cell region is smaller than an average distance of neighboring trenches located in the carrier confinement reduction region and an average distance of neighboring trenches located in the sensitive region is larger than an average distance of neighboring trenches located in the carrier confinement reduction region.

16. The semiconductor device according to claim 12, wherein each trench of the plurality of trenches surrounds a body region of the plurality of body regions, wherein an average distance of neighboring body regions surrounded by trenches located in the cell region is smaller than an average distance of neighboring body regions surrounded by trenches located in the carrier confinement reduction region and an average distance of neighboring body regions surrounded by trenches located in the sensitive region is larger than an average distance of neighboring body regions surrounded by trenches located in the carrier confinement reduction region.

17. The semiconductor device according to claim 12, wherein gates are arranged in a first part of the plurality of trenches and a plurality of spacer structures are arranged within a second part of the plurality of trenches, wherein an average number of spacer structures between neighboring gates in the cell region is smaller than an average number of spacer structures between neighboring gates in the carrier confinement reduction region and an average number of spacer structures between neighboring gates in the sensitive region is larger than an average number of spacer structures between neighboring gates in the carrier confinement reduction region.

18. The semiconductor device according to claim 12, further comprising a barrier layer between the trenches of the cell region and between the trenches of the carrier confinement reduction region, wherein the barrier layer comprises the first conductivity type, wherein an average doping concentration of the barrier layer within the cell region is higher than an average doping concentration of the barrier layer within the carrier confinement reduction region.

19. The semiconductor device according to claim 1, wherein the collector layer comprises reverse conducting regions reaching through the collector layer to the drift layer and comprising the first conductivity type.

20. A method for forming a semiconductor device, the method comprising forming an insulated gate bipolar transistor arrangement, wherein the insulated gate bipolar transistor arrangement comprises a semiconductor structure comprising a collector layer, a drift layer, a plurality of body areas, a plurality of source areas and a plurality of gates, wherein the plurality of source areas and the drift layer comprise at least mainly a first conductivity type, wherein the plurality of body areas and the collector layer comprise at least mainly a second conductivity type, wherein the plurality of gates are arranged so that the gates are capable of causing a conductive channel between the source areas and the drift layer through the body areas, wherein the insulated gate bipolar transistor arrangement further comprises a carrier confinement reduction region laterally arranged between a cell region and a sensitive region, wherein the insulated gate bipolar transistor arrangement is formed so that the cell region comprises a first average density of free charge carriers, the carrier confinement reduction region comprises a second average density of free charge carriers and the sensitive region comprises a third average density of free charge carriers in an on-state of the insulated gate bipolar transistor arrangement, wherein the first average density of free charge carriers is larger than the second average density of free charge carriers and the second average density of free charge carriers is larger than the third average density of free charge carriers.

* * * * *